United States Patent
Mo et al.

(10) Patent No.: US 10,424,560 B2
(45) Date of Patent: Sep. 24, 2019

(54) THREE-DIMENSIONAL INTEGRATED CIRCUIT COOLING SYSTEM

(71) Applicant: Microjet Technology Co., Ltd., Hsinchu (TW)

(72) Inventors: Li-Pang Mo, Hsinchu (TW); Shih-Chang Chen, Hsinchu (TW); Chi-Feng Huang, Hsinchu (TW); Yung-Lung Han, Hsinchu (TW)

(73) Assignee: MICROJET TECHNOLOGY CO., LTD., Hsinchu (TW)

( * ) Notice: Subject to any disclaimer, the term of this patent is extended or adjusted under 35 U.S.C. 154(b) by 0 days.

(21) Appl. No.: 15/860,349

(22) Filed: Jan. 2, 2018

(65) Prior Publication Data

US 2018/0190618 A1 Jul. 5, 2018

(30) Foreign Application Priority Data

Jan. 5, 2017 (TW) .............................. 106100260 A

(51) Int. Cl.
| | | |
|---|---|---|
| *H01L 25/065* | (2006.01) | |
| *H01L 23/46* | (2006.01) | |
| *F28F 13/06* | (2006.01) | |
| *H01L 23/433* | (2006.01) | |
| *H01L 23/44* | (2006.01) | |

(52) U.S. Cl.
CPC .......... *H01L 25/0657* (2013.01); *F28F 13/06* (2013.01); *H01L 23/4336* (2013.01); *H01L 23/44* (2013.01); *H01L 23/46* (2013.01); *F28F 2250/08* (2013.01);

(Continued)

(58) Field of Classification Search
CPC . H01L 25/0657; H01L 23/4336; H01L 23/44; H01L 23/46; H01L 2225/06589; H01L 2225/06555; H01L 2225/06513; F28F 13/06; F28F 2250/08
See application file for complete search history.

(56) References Cited

U.S. PATENT DOCUMENTS

| | | | | |
|---|---|---|---|---|
| 6,717,812 B1* | 4/2004 | Pinjala | ................... | H01L 23/473 165/80.4 |
| 2005/0205241 A1* | 9/2005 | Goodson | ............... | F04B 19/006 165/80.4 |

(Continued)

*Primary Examiner* — Anthony M Haughton
*Assistant Examiner* — Yahya Ahmad
(74) *Attorney, Agent, or Firm* — Birch, Stewart, Kolasch & Birch, LLP

(57) ABSTRACT

A three-dimensional integrated circuit cooling system is provided for removing heat from a three-dimensional integrated circuit. Plural fluid microchannels are formed among plural middle chip layers and a main chip layer of the three-dimensional integrated circuit. The three-dimensional integrated circuit cooling system comprises a base and a fluid pump. The base has an introduction opening, a discharge opening and a fluid passage. The fluid pump is fixed on the base and seals the edge of the introduction opening. When the fluid pump is enabled, an ambient fluid is driven by the fluid pump, introduced into the fluid passage through the introduction opening, and discharged through the discharge opening. The discharged fluid passes along every fluid microchannel of the three-dimensional integrated circuit as flowing through the plural middle chip layers and the main chip layer so as to perform heat exchange therewith.

12 Claims, 16 Drawing Sheets

(52) U.S. Cl.
CPC ............ *H01L 2225/06513* (2013.01); *H01L 2225/06555* (2013.01); *H01L 2225/06589* (2013.01)

(56) References Cited

U.S. PATENT DOCUMENTS

| | | | | |
|---|---|---|---|---|
| 2010/0328889 | A1* | 12/2010 | Campbell | H05K 7/20809 361/700 |
| 2012/0331433 | A1* | 12/2012 | Brunschwiler | H01L 23/473 716/110 |
| 2015/0173251 | A1* | 6/2015 | Campbell | H05K 7/20772 361/699 |
| 2016/0020160 | A1* | 1/2016 | Buvid | H05K 7/20236 257/692 |
| 2016/0218048 | A1* | 7/2016 | Kazemi | H01L 23/3672 |
| 2017/0323843 | A1* | 11/2017 | Ganguly | H01L 23/467 |

* cited by examiner

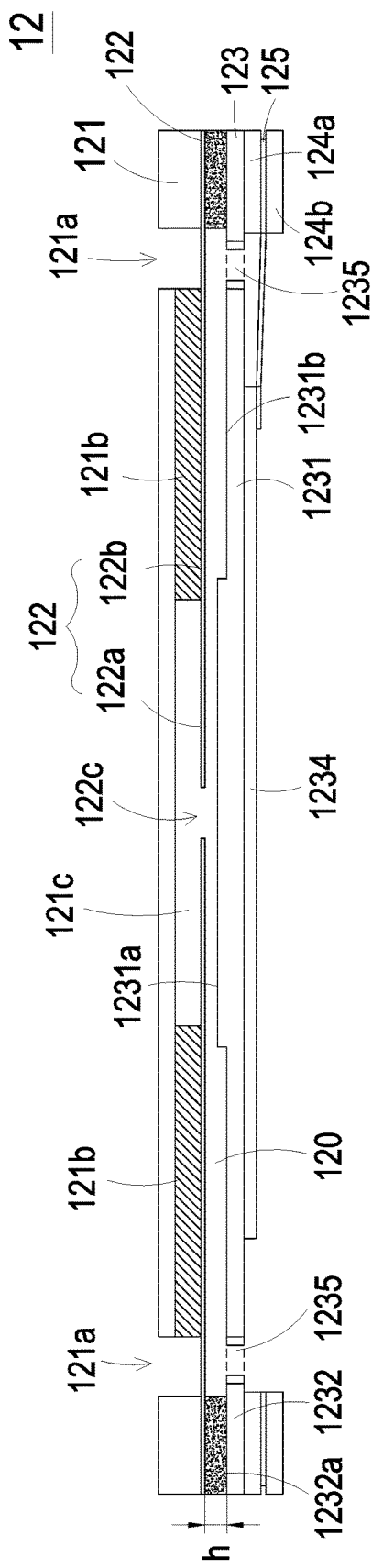
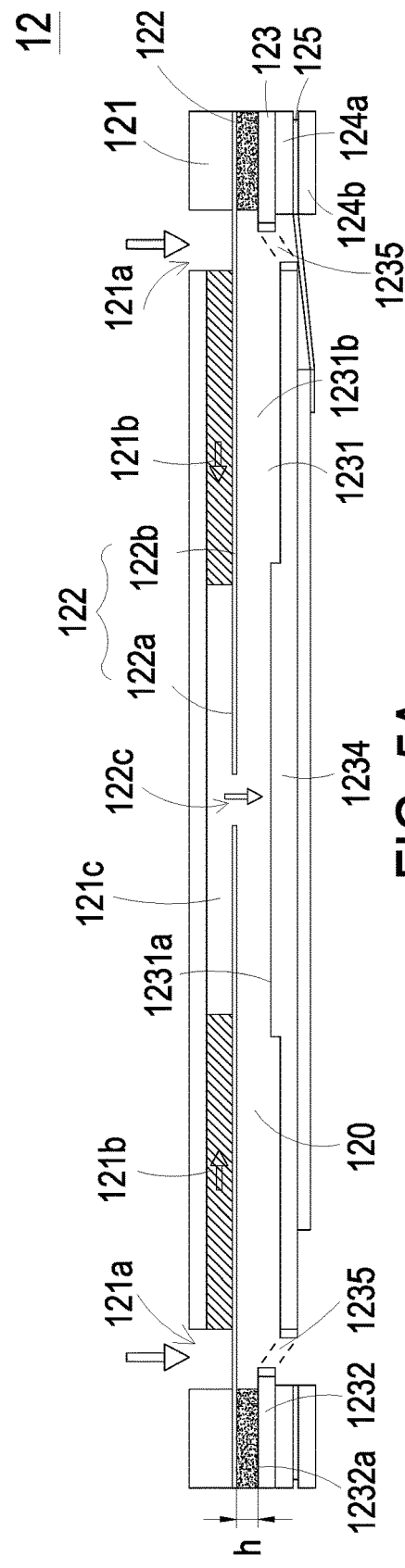
FIG. 4
FIG. 5A

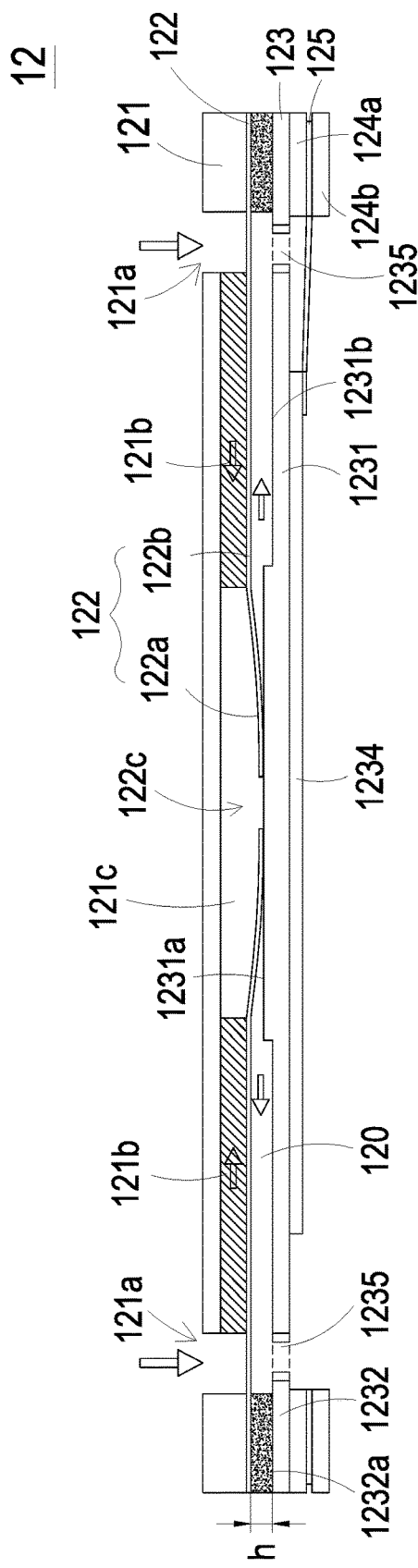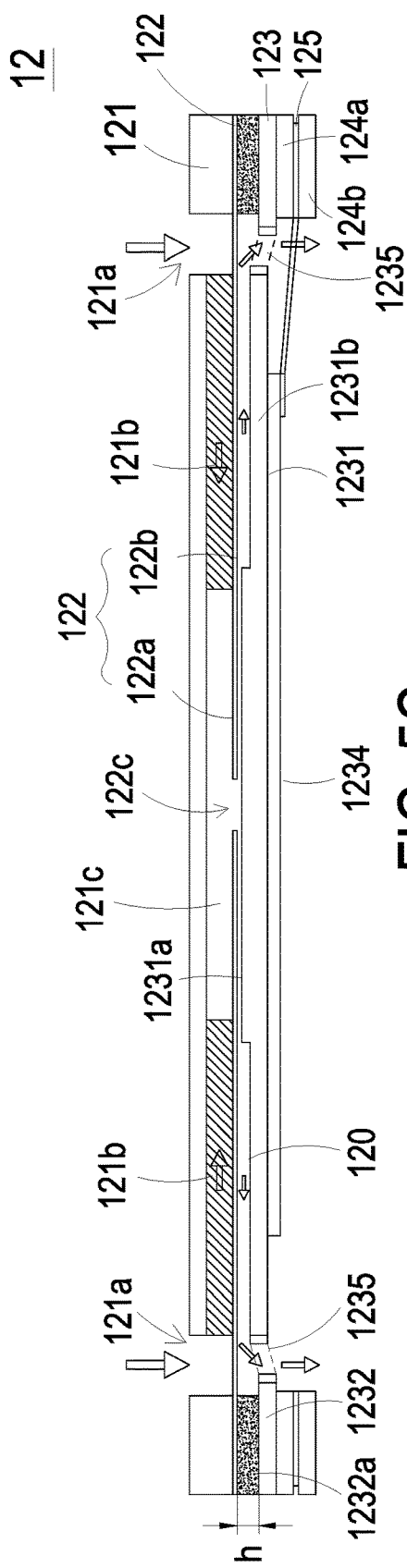

THREE-DIMENSIONAL INTEGRATED CIRCUIT COOLING SYSTEM

CROSS-REFERENCE TO RELATED APPLICATION

This application claims priority to Taiwan Patent Application No. 106100260, filed on Jan. 5, 2017. The entire content of the above-mentioned patent application is incorporated herein by reference for all purposes.

FIELD OF THE INVENTION

The present invention relates to a three-dimensional integrated circuit cooling system, and more particularly to a three-dimensional integrated circuit cooling system using a fluid pump to produce a fluid flow to remove heat.

BACKGROUND OF THE INVENTION

With increasing development of science and technology, the trends of designing electronic devices such as portable computers, tablet computers, industrial computers, portable communication devices or video players are designed toward minimization, easy portability and high performance. Generally, the limited space inside the electronic device is equipped with various high-integration or high-power electronic components for increasing the computing speed and the function of the electronic device, thus generating a great deal of heat during operations. Consequently, the temperature inside the device is increased and high temperature is harmful to the components. Since the electronic device is usually designed as possible as in slim, flat and succinct appearance, it has insufficient inner space for dissipating the waste heat. In case that the heat is not effectively dissipated away, the electronic components of the electronic device are adversely affected by the heat and the high temperature and may result in the interference of operation or damaged of the device.

Nowadays, the three-dimensional integrated circuit (3D IC) is widely applied in portable electronic products, such as smart phones, tablet computers and so on. The three-dimensional integrated circuit includes plural two-dimensional chips, and the two-dimensional chips are bonded by wire bonding technique. By the wire bonding technique like wafer-level packaging (WIT) and package on package (POP), plural leads are bonded between the two-dimensional chips, and thus the three-dimensional integrated circuit are formed by stacking layers of chips. The three-dimensional integrated circuit has compact size and advantages of minimization, lightweight, low cost, high performance, low power consumption and high speed.

The conventional heat-dissipating means of the three-dimensional integrated circuit is disposing the thermal conductive material on the three-dimensional integrated circuit to remove heat. The thermal conductive material is for example a graphite sheet, a metal sheet, heat pipe or other thermal conductive material. However, the above-mentioned heat-dissipating means is passive heat dissipation, which utilizes the thermal conduction and natural convention to remove heat. Therefore, the heat-dissipating efficiency is low, and the applicable requirements can't be satisfied.

Therefore, there is a need of providing a three-dimensional integrated circuit cooling system with improved heat-dissipating efficiency to substitute the conventional technologies.

SUMMARY OF THE INVENTION

An object of the present invention provides a three-dimensional integrated circuit cooling system, which is applied to various electronic devices to remove heat generated by a three-dimensional integrated circuit of the electronic device. The use of the three-dimensional integrated circuit cooling system can increase the heat-dissipating efficiency and prevent generating unacceptable noise. Consequently, the performance of the three-dimensional integrated circuit of the electronic device is stabilized, and the life spans of the three-dimensional integrated circuit are extended.

In accordance with an aspect of the present invention, a three-dimensional integrated circuit cooling system is provided for removing heat from a three-dimensional integrated circuit. The three-dimensional integrated circuit comprises a main chip layer, plural middle chip layers and plural fluid microchannels. The main chip layer and the plural middle chip layers are stacked on each other, wherein every two neighboring middle chip layers are in electrical communication through plural leads, and so do the main chip layer and the middle chip layer which is closest to the main chip layer. Every two neighboring middle chip layers form a fluid microchannel therebetween, and so do the main chip layer and the middle chip layer which is closest. The three-dimensional integrated circuit cooling system comprises a base and a fluid pump. The base is located beside the three-dimensional integrated circuit and has an introduction opening, a discharge opening and a fluid passage. The fluid pump is fixed on the base and seals the edge of the introduction opening. When the fluid pump is enabled, a fluid is driven by the fluid pump, introduced into the fluid passage through the introduction opening, and discharged through the discharge opening. The discharged fluid passes along each of the plural fluid microchannels of the three-dimensional integrated circuit as flowing through the plural middle chip layers and the main chip layer, thus heat exchange between the fluid and any of the plural middle chip layers and between the fluid and the main chip layer occurs.

In accordance with an aspect of the present invention, a three-dimensional integrated circuit cooling system is provided for removing heat from a three-dimensional integrated circuit. The three-dimensional integrated circuit comprises a main chip layer, plural middle chip layers and plural fluid microchannels. The main chip layer and the plural middle chip layers are stacked on each other, wherein every two neighboring middle chip layers are in electrical communication through plural leads, and so do the main chip layer and the middle chip layer which is closest to the main chip layer. Every two neighboring middle chip layers form a fluid microchannel therebetween, and so do the main chip layer and the middle chip layer which is closest. The three-dimensional integrated circuit cooling system comprises a base, a casing and a fluid pump. The base is located beside the three-dimensional integrated circuit and has an introduction opening, a discharge opening and a fluid passage. The casing has an inlet, an outlet and an accommodation space. The casing encapsulates the three-dimensional integrated circuit. The inlet is disposed corresponding to the discharge opening and is in communication with the discharge opening. The fluid pump is fixed on the base and seals the edge of the introduction opening. When the fluid pump is enabled, a fluid is driven by the fluid pump, introduced into the fluid passage through the introduction opening. After flowing through the fluid passage, the fluid is discharged by the discharge opening and is guided into the accommodation space of the casing through the and the inlet. Then, the fluid passes along each of the plural fluid microchannels of the three-dimensional integrated circuit as flowing through the plural middle chip layers and the main chip layer so as to implement heat exchange with the plural middle chip layers and the main chip layer. The heated fluid is then discharged to the exterior surroundings of the three-dimensional integrated circuit through the plural fluid microchannels and the outlet of the casing.

In accordance with an aspect of the present invention, a three-dimensional integrated circuit cooling system is provided for removing heat from a three-dimensional integrated circuit. The three-dimensional integrated circuit comprises a main chip layer and plural middle chip layers. The main chip layer and the plural middle chip layers are stacked on each other, wherein every two neighboring middle chip layers are in electrical communication through plural leads, and so do the main chip layer and the middle chip layer which is closest to the main chip layer. Every two neighboring middle chip layers form a fluid microchannel therebetween, and so do the main chip layer and the middle chip layer which is closest. The three-dimensional integrated circuit cooling system comprises a base, a casing, a fluid pump and a fluid storage. The base is located beside the three-dimensional integrated circuit and has an introduction opening, a discharge opening and a fluid passage. The casing has an inlet, an outlet and an accommodation space. The casing encapsulates the three-dimensional integrated circuit. The inlet is disposed corresponding to the discharge opening, and is in communication with the discharge opening. The fluid pump is fixed on the base and seals the edge of the introduction opening. The fluid storage disposed on the fluid pump to enclose and seal the fluid pump, while an inner space of the fluid storage is in communication with the input apertures of the fluid pump. The fluid storage is configured to store a fluid. When the fluid pump is enabled, the fluid stored in the fluid storage is introduced into the fluid passage through the introduction opening. After flowing through the fluid passage, the fluid is discharged by the discharge opening and is guided into the accommodation space of the casing through the inlet. Then, the fluid passes along each of the plural fluid microchannels of the three-dimensional integrated circuit as flowing through the plural middle chip layers and the main chip layer so as to implement heat exchange with the plural middle chip layers and the main chip layer. When the fluid pump stops operating, the heated fluid flows back into the fluid storage.

BRIEF DESCRIPTION OF THE DRAWINGS

FIG. 4 is a schematic cross-sectional view illustrating the fluid pump shown in FIGS. 2A and 2B;

FIGS. 5A to 5E schematically illustrate the actions of the fluid pump of FIGS. 2A and 2B;

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
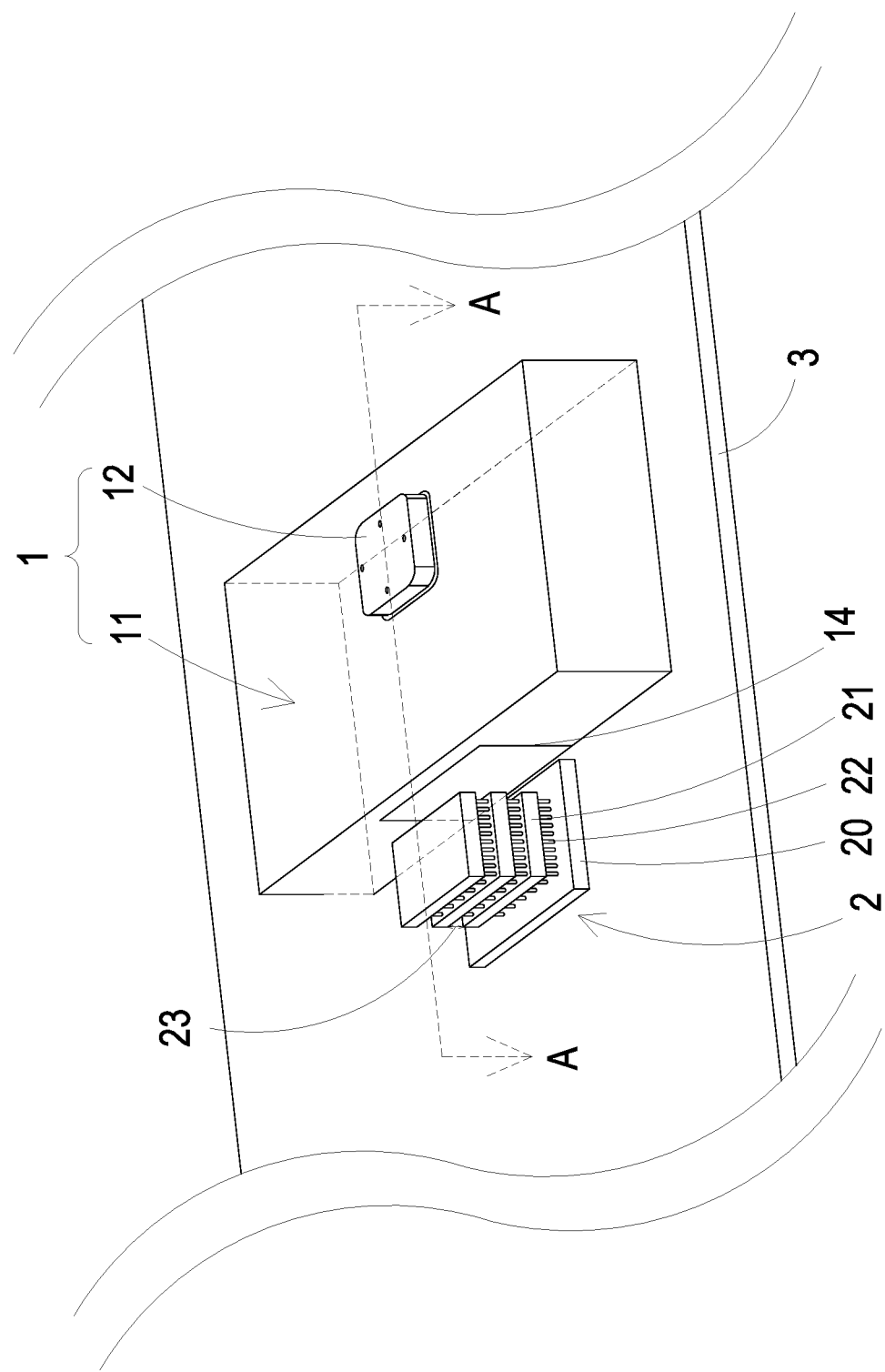
FIG. 1A is a schematic perspective view illustrating the structure of a three-dimensional integrated circuit cooling system according to a first embodiment of the present invention.
Figure 1B:
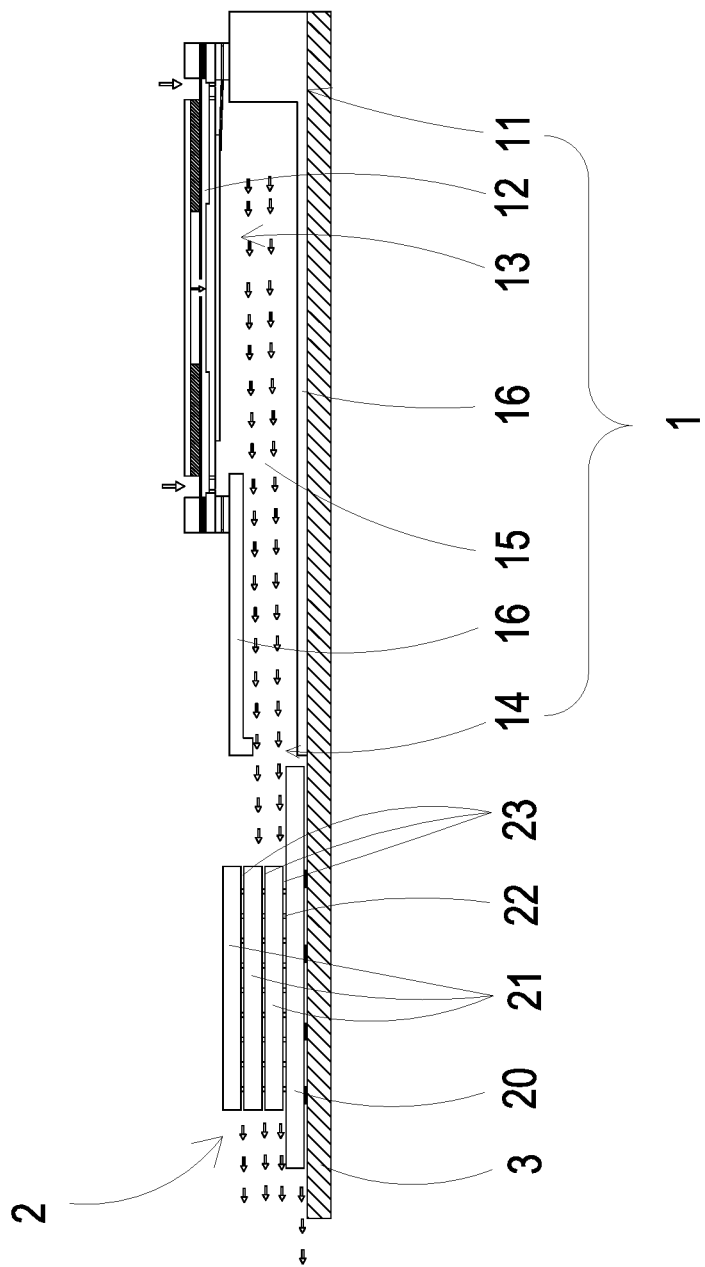
FIG. 1B is a schematic cross-sectional view illustrating the three-dimensional integrated circuit cooling system of FIG. 1A.

FIG. 1A is a schematic perspective view illustrating the structure of a three-dimensional integrated circuit cooling system according to a first embodiment of the present invention, and FIG. 1B is a schematic cross-sectional view illustrating the three-dimensional integrated circuit cooling system of FIG. 1A. As shown in FIGS. 1A and 1B, the three-dimensional integrated circuit cooling system 1 is applied to an electronic device to remove the heat generated by a three-dimensional integrated circuit 2 of the electronic device. An example of the electronic device includes but is not limited to a portable computer, a tablet computer, an industrial computer, a portable communication device or a video player, FIG. 1B is the schematic cross-sectional view illustrating the three-dimensional integrated circuit cooling system of FIG. 1A taken along the section AA. The three-dimensional integrated circuit 2 is mounted on the substrate 3 and located beside the three-dimensional integrated circuit cooling system 1. The three-dimensional integrated circuit 2 includes a main chip layer 20 and plural middle chip layers 21, which are stacked on each other. By the plural leads 22, every two neighboring middle chip layers 21 are in electrical communication with each other, and the main chip layer 20 is in electrical communication with the neighboring middle chip layer 21. Therefore, plural fluid microchannels 23 are formed between every two neighboring middle chip layers 21, and formed between the main chip layer 20 and the middle chip layer 21.

As shown in FIG. 1B, the three-dimensional integrated circuit cooling system 1 includes a base 11 and a fluid pump 12. The base 11 has an introduction opening 13, a discharge opening 14 and a fluid passage 15. The fluid pump 12 is fixed on the introduction opening 13 of the base 11 as sealing the edge of the introduction opening 13. When the fluid pump 12 is enabled, the ambient fluid outside the three-dimensional integrated circuit cooling system 1 is introduced into the fluid passage 15 through the introduction opening 13. After passing through the fluid passage 15, the fluid is discharged through the discharge opening 14. Afterwards, the discharged fluid passes along each of the fluid microchannels 23 of the three-dimensional integrated circuit 2, so as to perform heat exchange with the middle chip layers 21 and with the main chip layer 20. Consequently, the fluid removes heat from the middle chip layers 21 and the main chip layer 20. As a result, the waste heat generated by the three-dimensional integrated circuit 2 is dissipated away.

In this embodiment, the base 11 includes plural partitions 16 assembled with each other. The assembly of the partitions 16 defines the introduction opening 13, the discharge opening 14 and the fluid passage 15. The fluid pump 12 is fixed on one of the partitions 16 of the base 11. Moreover, the base 11 is located beside the three-dimensional integrated circuit 2 while the discharge opening 14 is disposed corresponding to the three-dimensional integrated circuit 2. That is, the discharge opening 14 is orientated to the three-dimensional integrated circuit 2. In this embodiment, the fluid for cooling is particularly but not exclusively to an air. The fluid type can be adjusted in accordance with the practical requirements of the heat-dissipating effect.

According to the first embodiment of the present invention, the fluid pump 12 is a piezoelectric fluid pump for driving the fluid. The fluid pump 12 is operable to continuously introduce the external ambient fluid into the fluid passage 15 through the introduction opening 13. When the fluid is introduced into the fluid passage 15, the fluid pump 12 drives the fluid to quickly flow and be discharged through the discharge opening 14 of the base 11. Since the base 11 is located beside the three-dimensional integrated circuit 2 while the discharge opening 14 is orientated to the three-dimensional integrated circuit 2, the discharged fluid would enter the fluid microchannels 23 of the neighboring three-dimensional integrated circuit 2 and flow through, so as to perform heat exchange with the plural middle chip layers 21 and the main chip layer 20. Afterwards, the heated fluid is discharge to the exterior surroundings of the three-dimensional integrated circuit 2 through the fluid microchannels 23. The fluid pump 12 keeps feeding the fluid that performs heat exchange with the three-dimensional integrated circuit 2, so that the three-dimensional integrated circuit 2 maintains being cooled. Meanwhile, the heated fluid is discharged from the fluid microchannels 23. Consequently, the heat dissipation of the three-dimensional integrated circuit 2 is realized with higher heat-dissipating efficiency, and the life span and stability of performance of the three-dimensional integrated circuit 2 are increased.

Figure 2A:
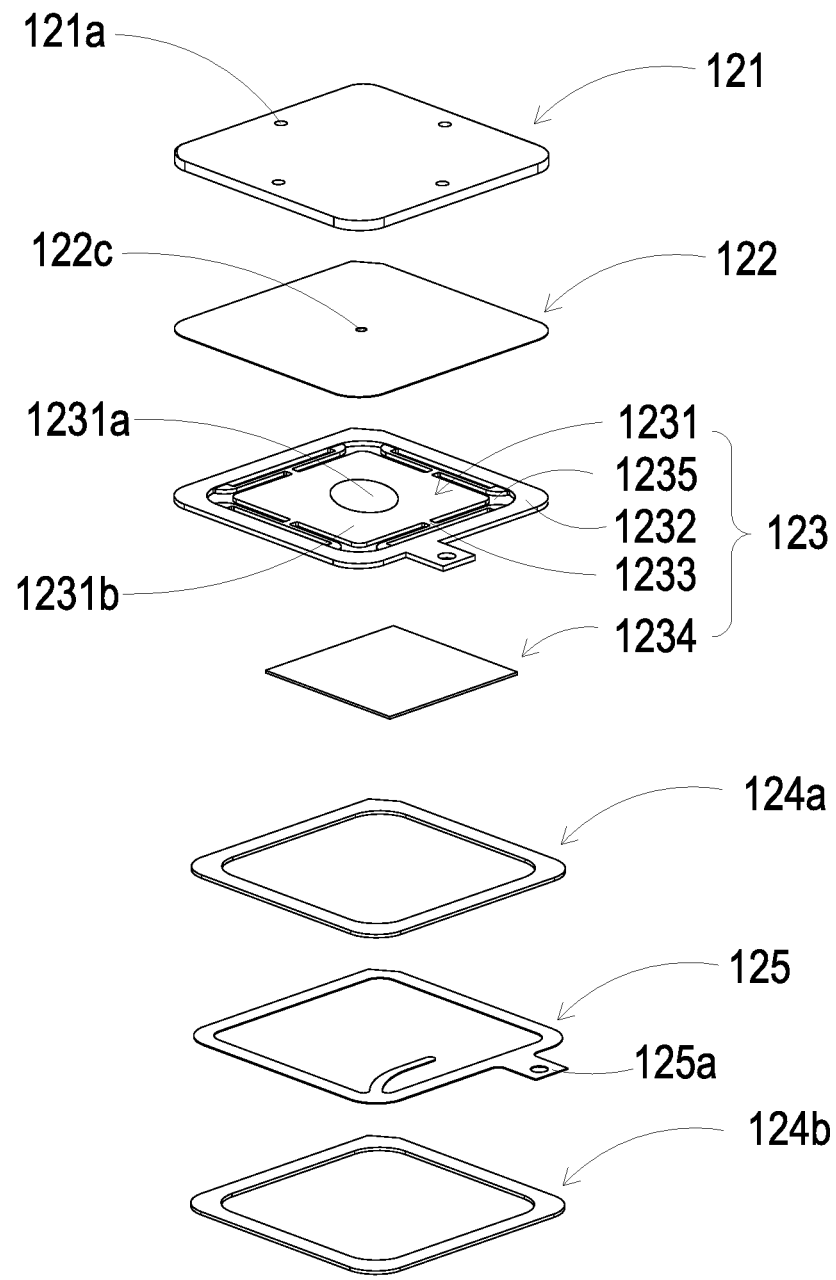
FIG. 2A is a schematic exploded view illustrating a fluid pump used in the three-dimensional integrated circuit cooling system according to the first embodiment of the present invention.
Figure 2B:
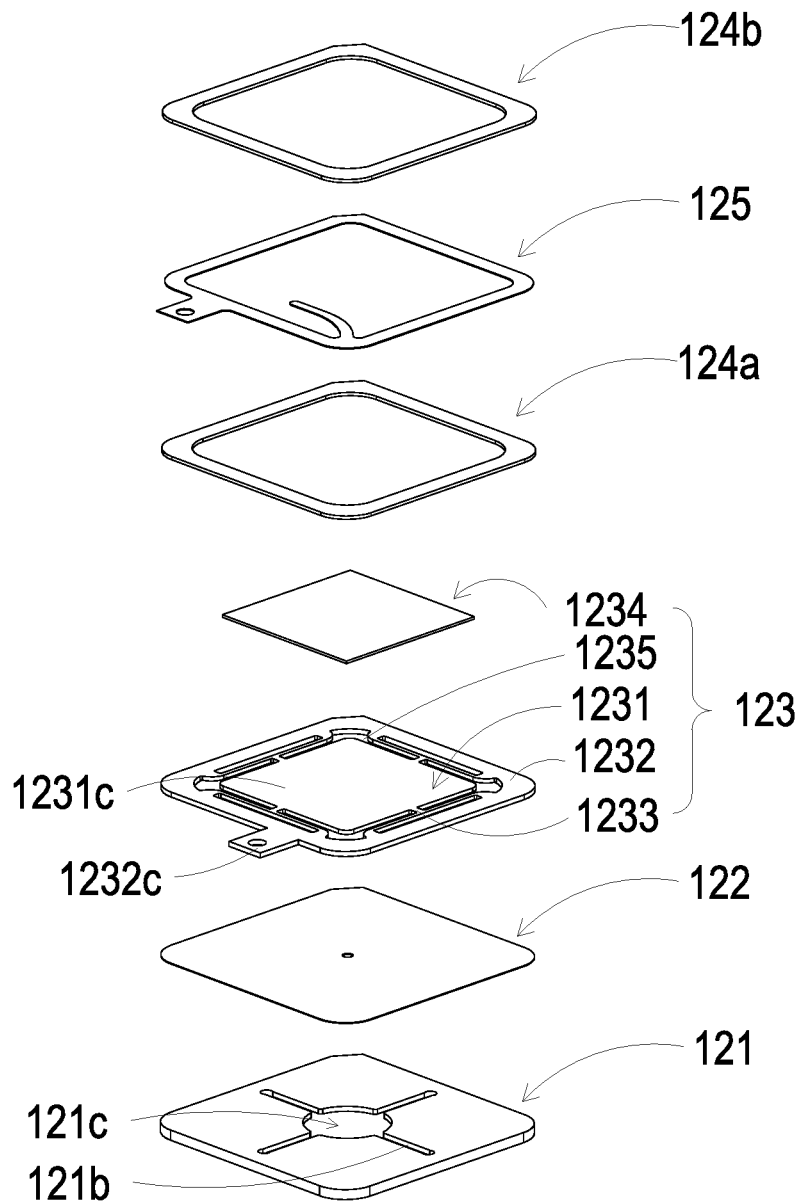
FIG. 2B is a schematic exploded view illustrating the fluid pump of FIG. 2A and taken along another viewpoint.
Figure 3:
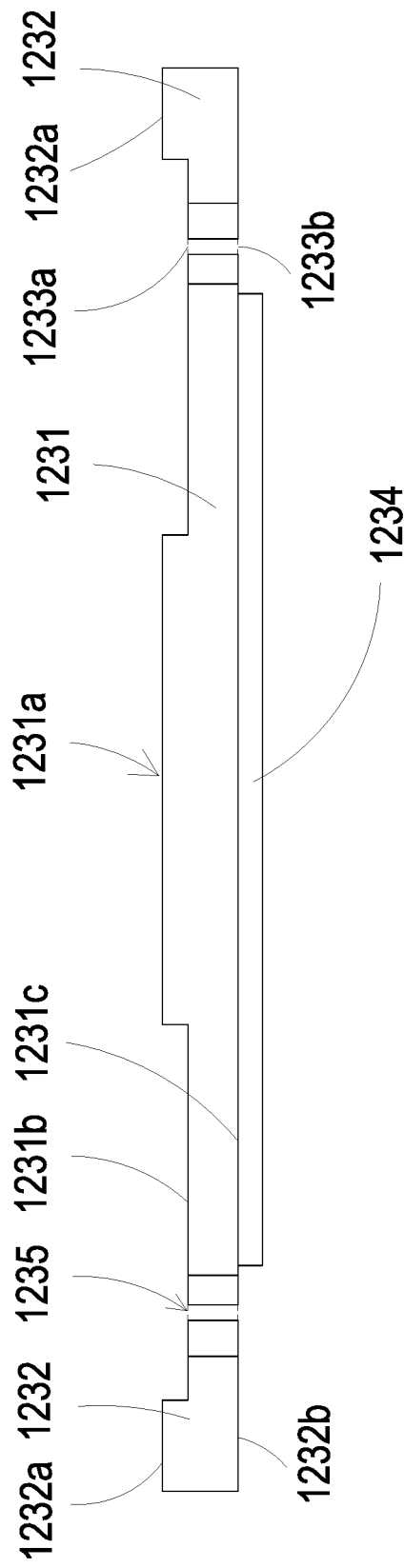
FIG. 3 is a schematic cross-sectional view illustrating a piezoelectric actuator of the fluid pump shown in FIGS. 2A and 2B.

FIG. 2A is a schematic exploded view illustrating a fluid pump used in the three-dimensional integrated circuit cooling system according to the first embodiment of the present invention. FIG. 2B is a schematic exploded view illustrating the fluid pump of FIG. 2A and taken along another viewpoint. FIG. 3 is a schematic cross-sectional view illustrating a piezoelectric actuator of the fluid pump shown in FIGS. 2A and 2B. FIG. 4 is a schematic cross-sectional view illustrating the fluid pump shown in FIGS. 2A and 2B. As shown in FIGS. 2A, 2B, 3 and 4, the fluid pump 12 is a piezoelectric fluid pump including a fluid inlet plate 121, a resonance plate 122, a piezoelectric actuator 123, two insulation plates 124a, 124b and a conducting plate 125, which are stacked on each other sequentially. The piezoelectric actuator 123 is aligned with the resonance plate 122. After the above components are combined together, the cross-sectional view of the resulting structure of the fluid pump 12 is shown in FIG. 4.

The fluid inlet plate 121 includes at least one fluid inlet 121a. Preferably but not exclusively, the at least one fluid inlet 121a includes four fluid inlets 121a. The fluid inlets 121a run through the fluid inlet plate 121. In response to the action of the atmospheric pressure, the fluid is introduced into the fluid pump 12 through the fluid inlet 121a. Moreover, at least one convergence channel 121b is formed on a first surface of the fluid inlet plate 121, and is in communication with the at least one fluid inlet 121a on a second surface of the fluid inlet plate 121. Moreover, a central cavity 121c is located at the intersection of the four convergence channels 121b. The central cavity 121c is in communication with the at least one convergence channel 121b, such that the fluid entered by the fluid inlets 121a would be introduced into the at least one convergence channel 121b and is guided to the central cavity 121c. Consequently, the fluid can be transferred by the fluid pump 12. In this embodiment, the at least one fluid inlet 121a, the at least one convergence channel 121b and the central cavity 121c of the fluid inlet plate 121 are integrally formed. The central cavity 121c is a convergence chamber for temporarily storing the fluid. Preferably but not exclusively, the fluid inlet plate 121 is made of stainless steel. In some embodiments, the depth of the convergence chamber defined by the central cavity 121c is equal to the depth of the at least one convergence channel 121b. The resonance plate 122 is made of a flexible material, which is preferably but not exclusively copper. The resonance plate 122 further has a central aperture 122c corresponding to the central cavity 121c of the fluid inlet plate 121 that providing the fluid for flowing through.

The piezoelectric actuator 123 includes a suspension plate 1231, an outer frame 1232, at least one bracket 1233 and a piezoelectric plate 1234. The piezoelectric plate 1234 is attached on a first surface 1231c of the suspension plate 1231. In response to an applied voltage, the piezoelectric plate 1234 would be subjected to a deformation, and the suspension plate 1231 is subjected to a curvy vibration. The at least one bracket 1233 is connected between the suspension plate 1231 and the outer frame 1232, while the two ends of the bracket 1233 are connected with the outer frame 1232 and the suspension plate 1231 respectively, so that the bracket 1233 can elastically support the suspension plate 1231. At least one vacant space 1235 is formed between the bracket 1233, the suspension plate 1231 and the outer frame 1232. The at least one vacant space 1235 is in communication with the introduction opening 13 for allowing the fluid to go through. The type of the suspension plate 1231 and the outer frame 1232, and the type and the number of the at least one bracket 1233 may be varied according to the practical requirements. The outer frame 1232 is arranged around the suspension plate 1231. Moreover, a conducting pin 1232c is protruding outwardly from the outer frame 1232 so as to be electrically connected with an external circuit (not shown).

As shown in FIG. 3, the suspension plate 1231 has a bulge 1231*a* that makes the suspension plate 1231 a stepped structure. The bulge 1231*a* is formed on a second surface 1231*b* of the suspension plate 1231. The bulge 1231*a* may be a circular convex structure. A top surface of the bulge 1231*a* of the suspension plate 1231 is coplanar with a second surface 1232*a* of the outer frame 1232, while the second surface 1231*b* of the suspension plate 1231 is coplanar with a second surface 1233*a* of the bracket 1233. Moreover, there is a drop of specified amount from the bulge 1231*a* of the suspension plate 1231 (or the second surface 1232*a* of the outer frame 1232) to the second surface 1231*b* of the suspension plate 1231 (or the second surface 1233*a* of the bracket 1233). A first surface 1231*c* of the suspension plate 1231, a first surface 1232*b* of the outer frame 1232 and a first surface 1233*b* of the bracket 1233 are coplanar with each other. The piezoelectric plate 1234 is attached on the first surface 1231*c* of the suspension plate 1231. The suspension plate 1231 may be a square plate structure with two flat surfaces, but the type of the suspension plate 1231 may be varied according to the practical requirements. In an embodiment, the suspension plate 1231, the bracket 1233 and the outer frame 1232 are integrally formed and produced by using a metal plate (e.g., a stainless steel plate). In an embodiment, the length of the piezoelectric plate 1234 is smaller than the length of the suspension plate 1231. In another embodiment, the length of the piezoelectric plate 1234 is equal to the length of the suspension plate 1231. Similarly, the piezoelectric plate 1234 is a square plate structure corresponding to the suspension plate 1231.

In the fluid pump 12, the insulation plate 124*a*, the conducting plate 125 and the other insulation plate 124*b* are stacked on each other sequentially and located under the piezoelectric actuator 123. The profiles of the insulation plate 124*a*, the conducting plate 125 and the insulation plate 124*b* substantially match the profile of the outer frame 1232 of the piezoelectric actuator 123. The insulation plates 124*a*, 124*b* are made of an insulating material (e.g. a plastic material) for providing insulating efficacy. The conducting plate 125 is made of an electrically conductive material (e.g. a metallic material) for providing electrically conducting efficacy. Moreover, the conducting plate 125 has a conducting pin 125*a* so as to be electrically connected with an external circuit (not shown).

In an embodiment, the fluid inlet plate 121, the resonance plate 122, the piezoelectric actuator 123, the insulation plate 124*a*, the conducting plate 125 and the other insulation plate 124*b* of the fluid pump 12 are stacked on each other sequentially. Moreover, there is a gap h between the resonance plate 122 and the outer frame 1232 of the piezoelectric actuator 123, which is formed and maintained by a filler (e.g. a conductive adhesive) inserted therein in this embodiment. The gap h ensures the proper distance between the bulge 1231*a* of the suspension plate 1231 and the resonance plate 122, so that the contact interference is reduced and the generated noise is largely reduced. In some embodiments, the height of the outer frame 1232 of the piezoelectric actuator 123 is increased, so that a larger gap is formed between the resonance plate 122 and the piezoelectric actuator 123.

After the fluid inlet plate 121, the resonance plate 122 and the piezoelectric actuator 123 are combined together, a movable part 122*a* and a fixed part 122*b* of the resonance plate 122 are defined. A convergence chamber for converging fluid is defined by the movable part 122*a* of the resonance plate 122 and the fluid inlet plate 121 collaboratively. Moreover, a chamber 120 is formed between the resonance plate 122 and the piezoelectric actuator 123 for temporarily storing the fluid. Through the central aperture 122*c* of the resonance plate 122, the chamber 120 is in communication with the central cavity 121*c* of the fluid inlet plate 121. The peripheral regions of the chamber 120 are in communication with the underlying introduction opening 13 through the vacant space 1235 between the brackets 1233 of the piezoelectric actuator 123.

FIGS. 5A to 5E schematically illustrate the actions of the fluid pump of FIGS. 2A and 2B. Please refer to FIG. 4 and FIGS. 5A to 5E. The actions of the fluid pump 12 will be described as follows. When the fluid pump 12 is enabled, the piezoelectric actuator 123 is vibrated along a vertical direction in a reciprocating manner by using the bracket 1233 as the fulcrums. The resonance plate 122 except for the part of it fixed on the fluid inlet plate 121 is hereinafter referred as a movable part 122*a*, while the rest is referred as a fixed part 122*b*. Since the resonance plate 122 is light and thin, the movable part 122*a* vibrates along with the piezoelectric actuator 123 because of the resonance of the piezoelectric actuator 123. In other words, the movable part 122*a* is reciprocated and subjected to a curvy deformation. When the piezoelectric actuator 123 is vibrated downwardly, the movable part 122*a* of the resonance plate 122 is subjected to the curvy deformation because the movable part 122*a* of the resonance plate 122 is pushed by the fluid and vibrated in response to the piezoelectric actuator 123. In response to the downward vibration of the piezoelectric actuator 123, the fluid is fed into the at least one fluid inlet 121*a* of the fluid inlet plate 121. Then, the fluid is transferred to the central cavity 121*c* of the fluid inlet plate 121 through the at least one convergence channel 121*b*. Then, the fluid is transferred through the central aperture 122*c* of the resonance plate 122 corresponding to the central cavity 121*c*, and introduced downwardly into the chamber 120. As the piezoelectric actuator 123 is enabled, the resonance of the resonance plate 122 occurs. Consequently, the resonance plate 122 is also vibrated along the vertical direction in the reciprocating manner.

As shown in FIG. 5B, during the vibration of the movable part 122*a* of the resonance plate 122, the movable part 122*a* moves down till bring contacted with the bulge 1231*a* of the suspension plate 1231. In the meantime, the volume of the chamber 120 is shrunken and a middle space which was communicating with the convergence chamber is closed. Under this circumstance, the pressure gradient occurs to push the fluid in the chamber 120 moving toward peripheral regions of the chamber 120 and flowing downwardly through the vacant spaces 1235 of the piezoelectric actuator 123.

Please refer to FIG. 5C, which illustrates consecutive action following the action in FIG. 5B. The movable part 122*a* of the resonance plate 122 has returned its original position when, the piezoelectric actuator 123 has ascended at a vibration displacement to an upward position. Consequently, the volume of the chamber 120 is consecutively shrunken that generating the pressure gradient which makes the fluid in the chamber 120 continuously pushed toward peripheral regions. Meanwhile, the fluid continuously fed into the fluid inlets 121*a* of the fluid inlet plate 121 and transferred to the central cavity 121*c*.

Figure 5D:
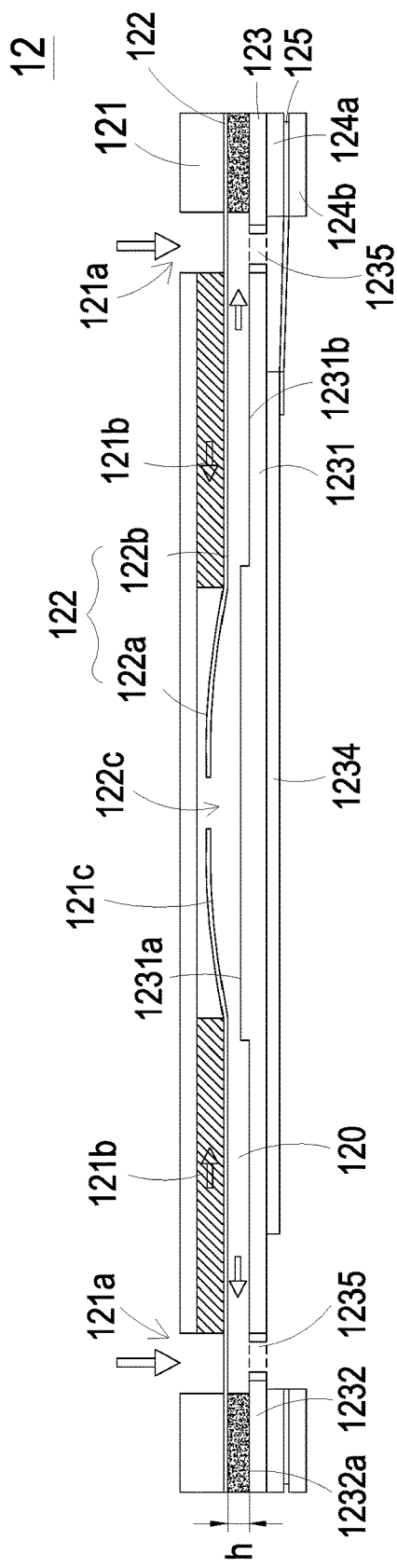

Then, as shown in FIG. 5D, the resonance plate 122 moves upwardly, which is caused by the resonance of the upward motion of the piezoelectric actuator 123. Consequently, the fluid is slowly fed into the fluid inlets 121*a* of the fluid inlet plate 121, and transferred to the central cavity 121*c*.

Figure 5E:
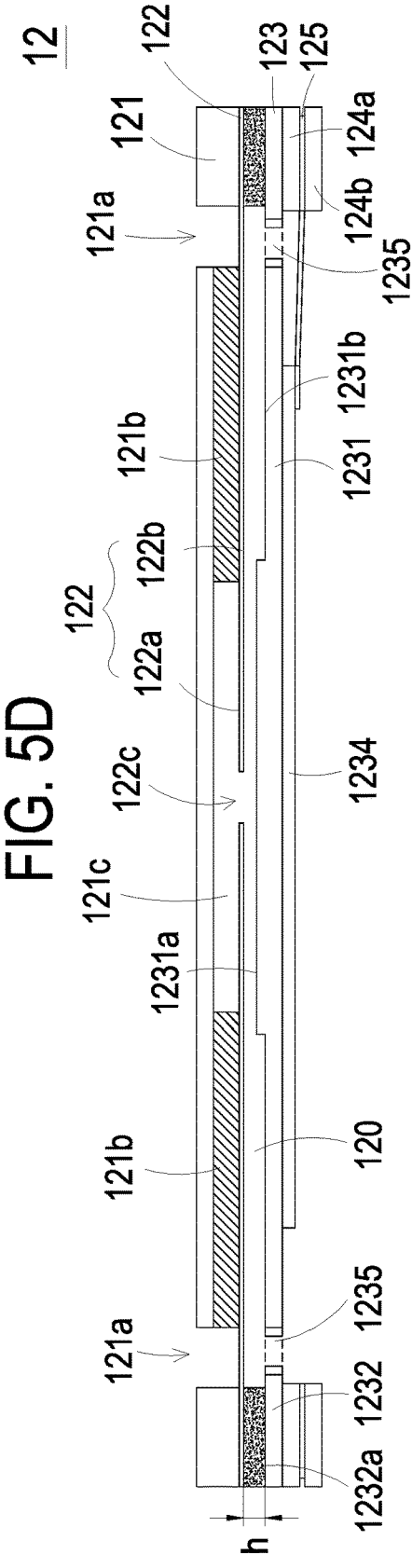

As shown in FIG. 5E, the movable part 122a of the resonance plate 122 has returned its original position. When the resonance plate 122 is vibrated along the vertical direction in the reciprocating manner, the gap h between the resonance plate 122 and the piezoelectric actuator 123 providing space for vibration of the resonance plate 122. That is, the thickness of the gap h affects the amplitude of vibration of the resonance plate 12. Consequently, a pressure gradient is generated in the fluid channels of the fluid pump 12 to facilitate the fluid to flow at a high speed. Moreover, since there is an impedance difference between the feeding direction and the exiting direction, the fluid can be transmitted from the inlet side to the outlet side. Moreover, even if the outlet side has a pressure, the fluid pump 12 still has the capability of pushing the fluid to the fluid passage 15 while achieving the silent efficacy.

The steps of FIGS. 5A to 5E are repeatedly done. Consequently, the ambient fluid is transferred by the fluid pump 12 from the outside to the inside.

As mentioned above, the operation of the fluid pump 12 can guide the fluid into the fluid passage 15 of the base 11 and discharge the fluid through the discharge opening 14. Then, the fluid is introduced into the fluid microchannels 23 of the three-dimensional integrated circuit 2 for heat exchange. Afterward, the heated fluid is quickly discharged to the surroundings of the three-dimensional integrated circuit cooling system 1. Consequently, the cooling efficiency is enhanced, and the performance stability and the life span of the three-dimensional integrated circuit 2 are increased.

Figure 6:
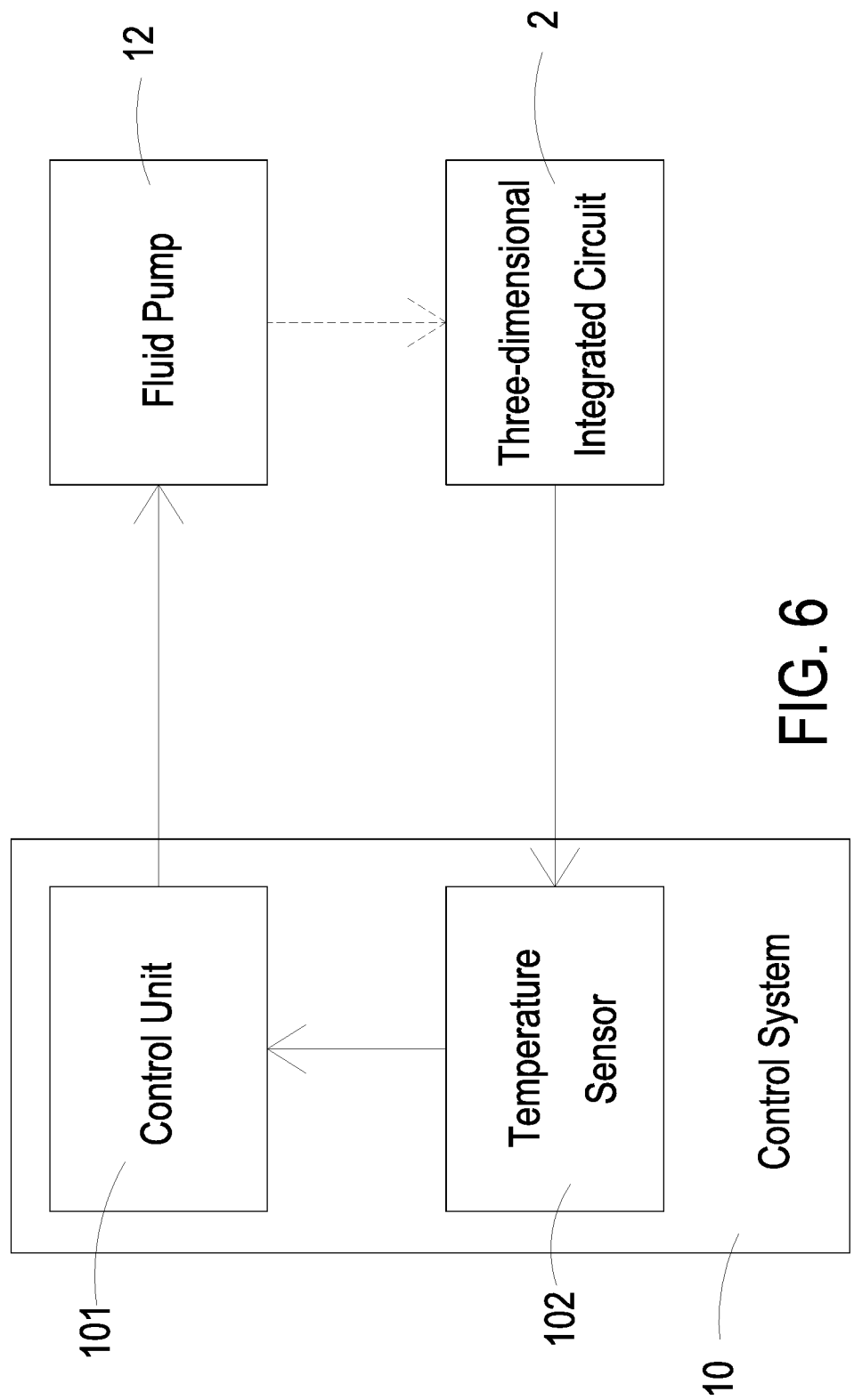
FIG. 6 is a schematic block diagram illustrating a control system for the three-dimensional integrated circuit cooling system according to the first embodiment of the present invention.
Figure 7:
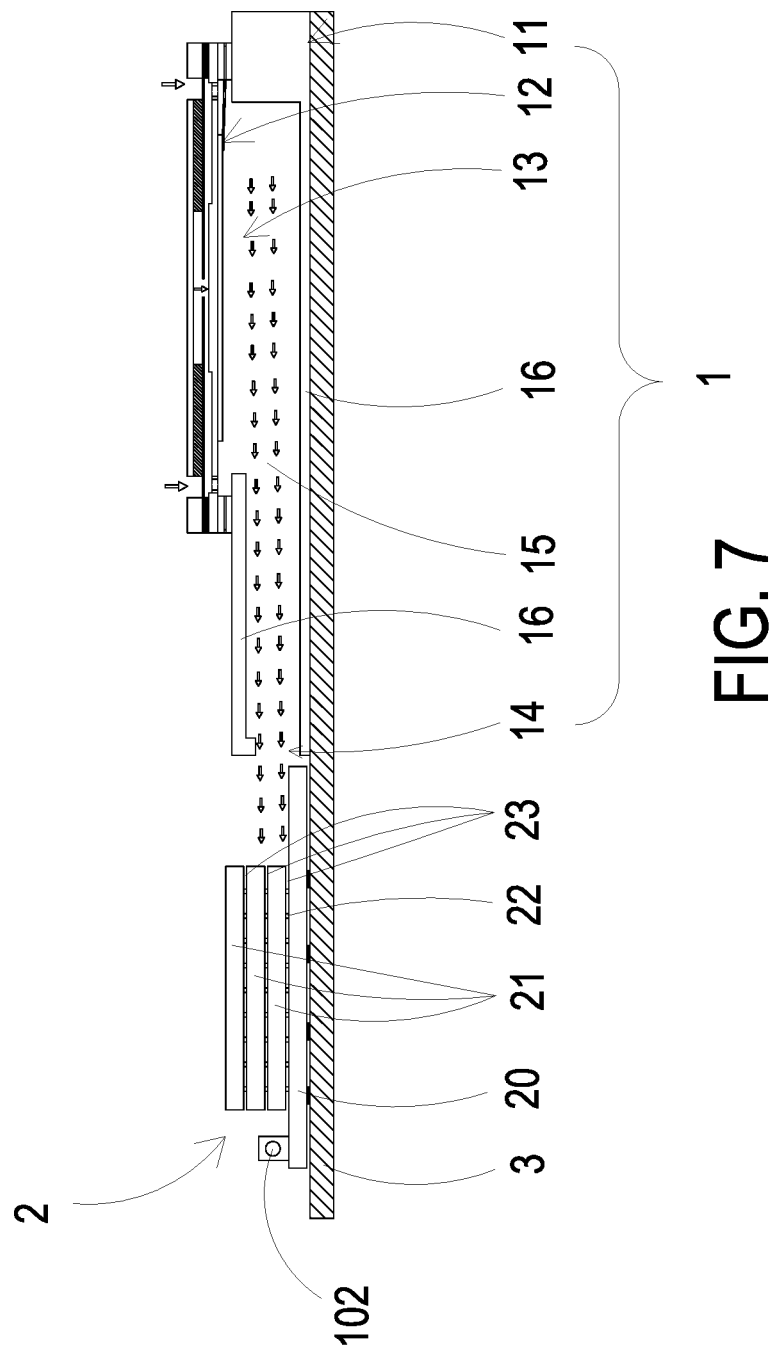
FIG. 7 is a schematic perspective view illustrating the structure of the three-dimensional integrated circuit cooling system according to the first embodiment of the present invention.

FIG. 6 is a schematic block diagram illustrating a control system for the three-dimensional integrated circuit cooling system according to the first embodiment of the present invention. FIG. 7 is a schematic perspective view illustrating the structure of the three-dimensional integrated circuit cooling system according to the first embodiment of the present invention. As shown in FIGS. 6 and 7, in an embodiment, the three-dimensional integrated circuit cooling system 1 has the function of temperature control. Namely, the three-dimensional integrated circuit cooling system 1 further includes a control system 10, but not exclusively. The control system 10 includes a control unit 101 and a temperature sensor 102. The control unit 101 is electrically connected with the fluid pump 12 so as to control the operation of the fluid pump 12. The temperature sensor 102 may be located near the surrounding of the three-dimensional integrated circuit 2 (as the location shown in FIG. 7) so as to detect the temperature of the three-dimensional integrated circuit 2. Alternatively, the temperature sensor 102 may be directly attached on the main chip layer 20 or the middle chip layer 21 of the three-dimensional integrated circuit 2, so as to detect the temperature of the three-dimensional integrated circuit 2. However, the disposition means of the temperature sensor 102 is not limited thereto. The temperature sensor 102 is electrically connected with the control unit 101 to which the detected temperature as a detecting signal is transmitted. According to the detecting signal from the temperature sensor 102, the control unit 101 judges whether the temperature of the three-dimensional integrated circuit 2 is higher than a temperature threshold value. If the temperature of the three-dimensional integrated circuit 2 is higher than the temperature threshold value, the control unit 101 sends a control signal to the fluid pump 12 for enabling the fluid pump 12. As so, the fluid pump 12 drives the fluid to remove the heat generated by the three-dimensional integrated circuit 2, and the temperature of the three-dimensional integrated circuit 2 is reduced. On the contrary, if the temperature of the three-dimensional integrated circuit 2 is lower than the temperature threshold value, the control unit 101 sends a control signal to the fluid pump 12 for disabling the fluid pump 12. As so, the fluid pump 12 operates only when high temperature is detected, thus the life span of the fluid pump 12 can be prolonged. Namely, by disposing the control system 10, the three-dimensional integrated circuit 2 dissipates heat via the fluid pump 12 of the three-dimensional integrated circuit cooling system 1 when the temperature thereof is too high, and the three-dimensional integrated circuit 2 is stopped operating when the temperature thereof is low enough. Consequently, the life span of the fluid pump 12 is prolonged, and the unneeded wastage of energy is reduced. Moreover, the three-dimensional integrated circuit 2 can operate under a suitable temperature environment, and the stability of the three-dimensional integrated circuit 2 is enhanced.

In an embodiment, the control unit 101 of the control system 10 controls the input voltage of the fluid pump 12 to maintain at a specific voltage. Therefore, the fluid pump 12 outputs the maximum pressure, and the best heat-dissipating efficiency is achieved. Alternatively, the control unit 101 of the control system 10 controls the operation of fluid pump 12 to speed up or slow down. Therefore, the fluid pump 12 operates in accordance with the practical requirements of heat-dissipating. Consequently, by the temperature detection and control of the control system 10, the life span of the fluid pump 12 is prolonged, and the unneeded wastage of energy is reduced. Moreover, the three-dimensional integrated circuit 2 can operate under a suitable temperature environment, and the stability of the three-dimensional integrated circuit 2 is enhanced.

Figure 8A:
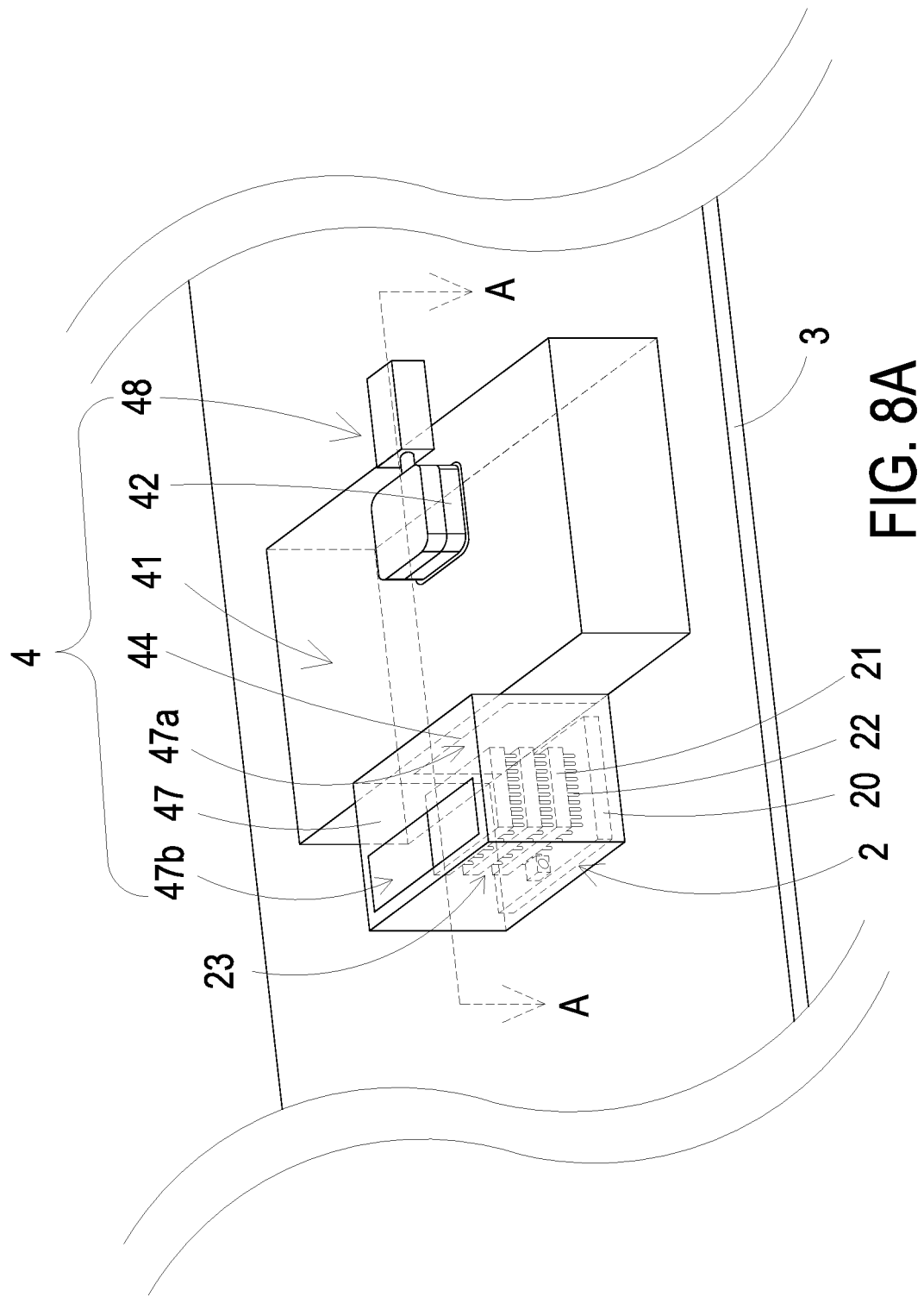
FIG. 8A is a schematic perspective view illustrating the structure of a three-dimensional integrated circuit cooling system according to a second embodiment of the present invention.
Figure 8B:
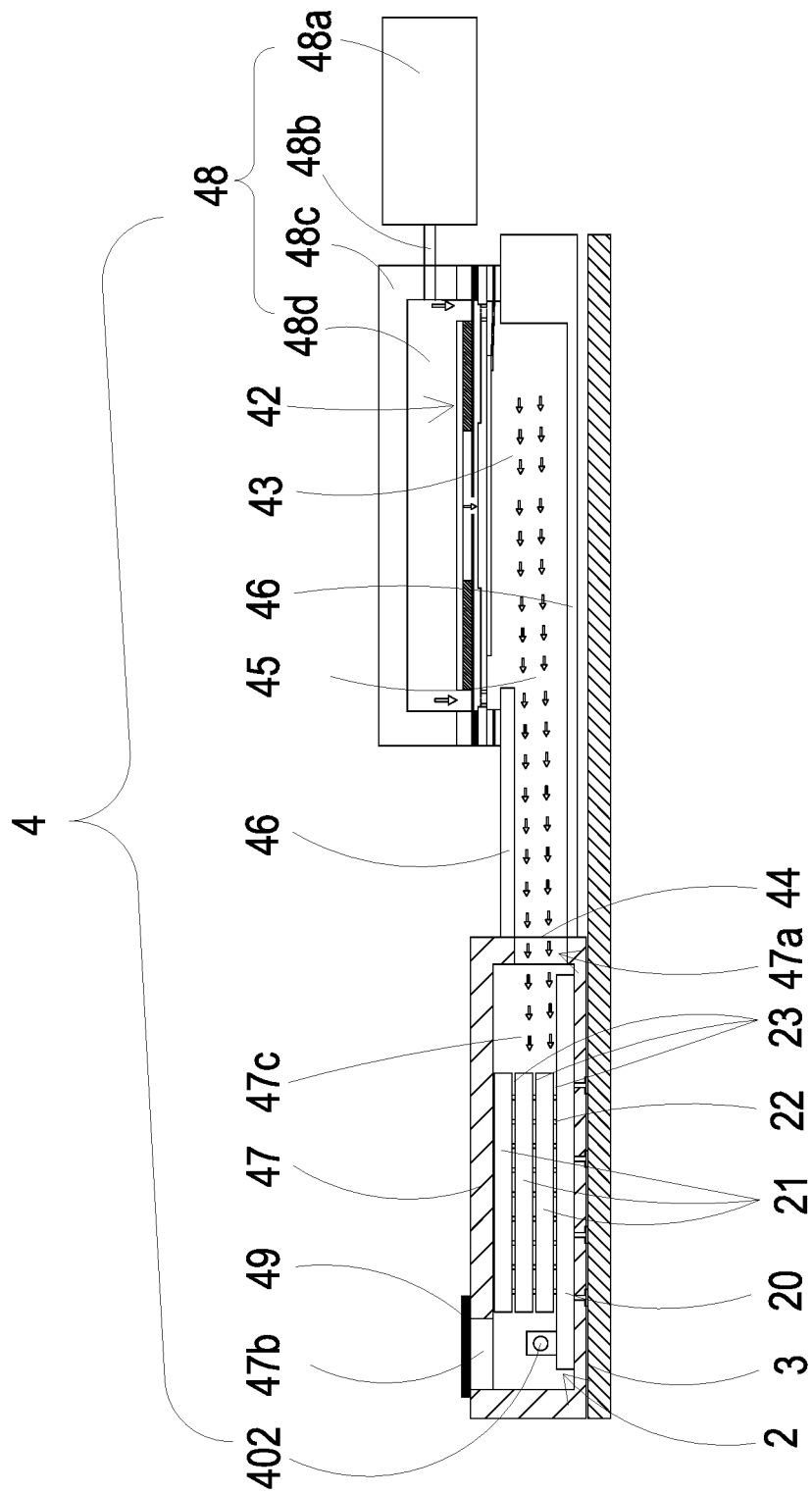
FIG. 8B is a schematic cross-sectional view illustrating the three-dimensional integrated circuit cooling system of FIG. 8A.

FIG. 8A is a schematic perspective view illustrating the structure of a three-dimensional integrated circuit cooling system according to a second embodiment of the present invention, and FIG. 8B is a schematic cross-sectional view illustrating the three-dimensional integrated circuit cooling system of FIG. 8A taken along the section AA. As shown in FIGS. 8A and 8B, the three-dimensional integrated circuit cooling system 4 according to the second embodiment of the present invention is applied to remove heat generated by the three-dimensional integrated circuit 2. The three-dimensional integrated circuit cooling system 4 includes a base 41, a fluid pump 42 and a casing 47. The base 41 is located beside the three-dimensional integrated circuit 2 and has an introduction opening 43, a discharge opening 44 and a fluid passage 45. The base 41 includes plural partitions 46 assembled with each other. The assembly of partitions 46 defines the introduction opening 43, the discharge opening 44 and the fluid passage 45. The fluid pump 42 is fixed on the introduction opening 43 of the base 41 as sealing the edge of the introduction opening 43. The fluid pump 42 is a piezoelectric fluid pump for guiding the fluid to the introduction opening 43. In this embodiment, the component parts, element and function of the base 41 and the fluid pump 42 are similar to those of the first embodiment of the present invention, and are not redundantly described herein. In comparison with those of the first embodiment of the present invention, the three-dimensional integrated circuit cooling system 4 further includes a casing 47. The casing 47 is configured to encapsulate the three-dimensional integrated circuit 2, and the casing 47 may be made of plastic. The casing 47 has an inlet 47a, an outlet 47b and an accommodation space 47c. The inlet 47a is disposed corresponding to and in communication with the discharge opening 44 of the base 41. The fluid pump 42 is operable to continuously introduce the external ambient fluid into the fluid passage 45 through the introduction opening 43. Then, the fluid pump 12 drives the fluid to flow into the accommodation space 47c of the casing 47 through the discharge opening 44 and the inlet 47a. Afterward, the discharged fluid passes along every fluid microchannel 23 of the three-dimensional integrated circuit 2 so as to perform heat exchange with the plural middle chip layers 21 and the main chip layer 20. The heated fluid is discharge to the exterior surroundings of the three-dimensional integrated circuit cooling system 4 through the outlet 47b of the casing 47. Consequently, the heat dissipation of the three-dimensional integrated circuit 2 is realized.

In this embodiment, the three-dimensional integrated circuit cooling system 4 further includes a filtering system 48. The filtering system 48 includes a filter 48a, a pipe 48b and a housing 48c. The housing 48c is disposed on the fluid pump 42, enclosing and sealing the fluid pump 42, while an inner space 48d of the housing 48c is in communication with the input apertures of the fluid pump 42. The pipe 48b is for example but not limited to a hollow pipe, and is in communication between the filter 48a and the inner space 48d of the housing 48c. The filter 48a includes but not limited to an air pressure filter and a filter net for filtering the fluid. After the fluid is filtered by the filter 48a, the filtered fluid flows into the inner space 48d of the housing 48c through the pipe 48b. Afterwards, the fluid pump 42 guides the filtered fluid to the introduction opening 43 so as to cool the three-dimensional integrated circuit 2. By disposing the filtering system 48, the fluid is filtered before cooling the three-dimensional integrated circuit 2. Therefore, the dust and particulate matter are prevented from heaping inside the three-dimensional integrated circuit 2 or the fluid pump 42. Consequently, the heat-dissipating efficiency is enhanced, and the life span of the elements is prolonged. In this embodiment, the fluid for cooling is particularly but not exclusively an air. The fluid type can be adjusted in accordance with the practical requirements of the heat-dissipating effect.

In an embodiment, the filtering system 48 further includes a filtering screen 49. Preferably but not exclusively, the filtering screen 49 is a stainless steel filtering screen. The filtering screen 49 is mounted on the outlet 47b of the casing 47 as sealing the edge of the outlet 47b. The filtering screen 49 is configured to filter the fluid. During the process of heat dissipation, the pressure inside the accommodation space 47c of the casing 47 is varied, which may cause the discharged fluid flowing back into the accommodation space 47c of the casing 47 through the outlet 47b. Consequently, by disposing the filtering screen 49 on the outlet 47b as sealing the edge of the outlet 47b, the discharged fluid is prevented from flowing back into the accommodation space 47c of the casing 47 through the outlet 47b. The heat-dissipating efficiency is enhanced, and the life span of the elements is prolonged.

Figure 8C:
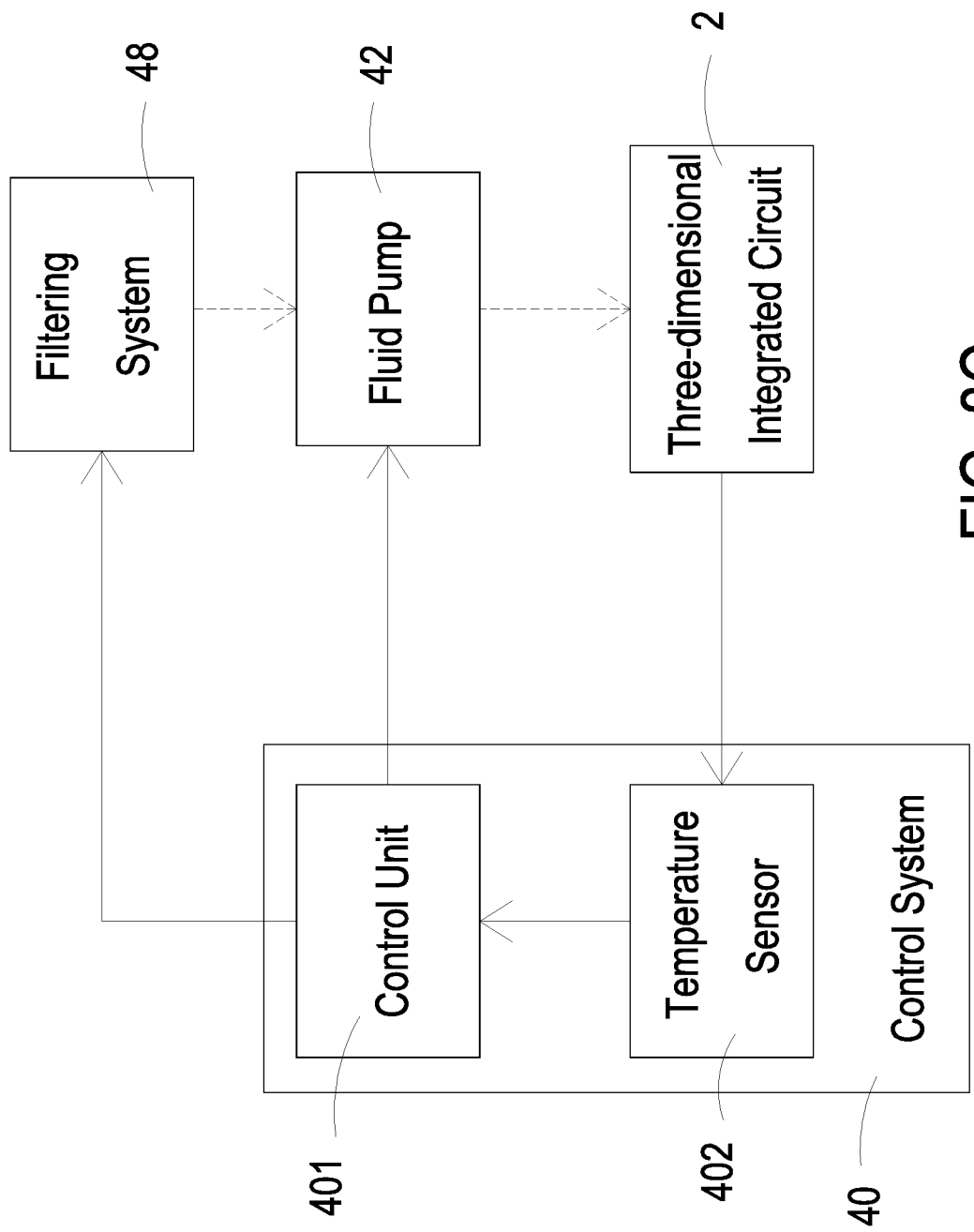
FIG. 8C is a schematic block diagram illustrating a control system for the three-dimensional integrated circuit cooling system according to the second embodiment of the present invention.

Please refer to FIGS. 8A, 8B and 8C. FIG. 8C is a schematic block diagram illustrating a control system for the three-dimensional integrated circuit cooling system according to the second embodiment of the present invention. In an embodiment, the three-dimensional integrated circuit cooling system 4 has the function of temperature control and includes a control system 40. The control system 40 includes a control unit 401 and a temperature sensor 402. The control unit 401 is electrically connected with the fluid pump 42 so as to control the operation of the fluid pump 42. The temperature sensor 402 may be located in the accommodation space 47c of the casing 47 and near the surrounding of the three-dimensional integrated circuit 2, so as to detect the temperature of the three-dimensional integrated circuit 2. Alternatively, the temperature sensor 402 may be directly attached on the main chip layer 20 or the middle chip layer 21 of the three-dimensional integrated circuit 2, so as to detect the temperature of the three-dimensional integrated circuit 2. The temperature sensor 402 is electrically connected with the control unit 401 to which the detected temperature as a detecting signal is transmitted. According to the detecting signal from the temperature sensor 402, the control unit 401 judges whether the temperature of the three-dimensional integrated circuit 2 is higher than a temperature threshold value. If the temperature of the three-dimensional integrated circuit 2 is higher than the temperature threshold value, the control unit 401 sends a control signal to the fluid pump 42 for enabling the fluid pump 42. As so, the fluid pump 42 drives the fluid to remove the heat generated by the three-dimensional integrated circuit 2, and the temperature of the three-dimensional integrated circuit 2 is reduced. On the contrary, if the temperature of the three-dimensional integrated circuit 2 is lower than the temperature threshold value, the control unit 401 sends a control signal to the fluid pump 42 for disabling the fluid pump 42. As so, the fluid pump 42 operates only when high temperature is detected, thus the life span of the fluid pump 42 can be prolonged. Namely, by disposing the control system 40, the three-dimensional integrated circuit 2 dissipates heat via the fluid pump 42 of the three-dimensional integrated circuit cooling system 1 when the temperature thereof is too high, and the three-dimensional integrated circuit 2 is stopped operating when the temperature thereof is low enough. Consequently, the life span of the fluid pump 42 is prolonged, and the unneeded wastage of energy is reduced. Moreover, the three-dimensional integrated circuit 2 can operate under a suitable temperature environment, and the stability of the three-dimensional integrated circuit 2 is enhanced.

Similarly, the control unit 401 is electrically connected with the filtering system 48. When the fluid pump 42 is operating, the control unit 401 sends a control signal to the filtering system 48 for enabling the filter 48a of the filtering system 48. The fluid is filtered by the filtering system 48, and then guided to the introduction opening 43 by the fluid pump 42. On the contrary, when the fluid pump 42 stops operating, the control unit 401 sends a control signal to the filtering system 48 for disabling the filter 48a of the filtering system 48. Consequently, the filtering system 48 is prevented from continuous operating, thus the life span of the filtering system 48 is prolonged. Moreover, the cooling efficiency is increased.

In addition, the control unit 401 of the control system 40 can control the input voltage of the filtering system 48 to maintain at a specific voltage. Therefore, the filtering system 48 outputs the maximum pressure, and the best heat-dissipating efficiency is achieved. Alternatively, the control unit 401 of the control system 40 controls the operation of filtering system 48 to speed up or slow down. Therefore, the filtering system 48 can operate in accordance with the practical requirements of heat-dissipating. Consequently, by the temperature detection and control of the control system 40, the life span of the filtering system 48 is prolonged, and the unneeded wastage of energy is reduced. Moreover, the three-dimensional integrated circuit 2 can operate under a suitable temperature environment, and the stability of the three-dimensional integrated circuit 2 is enhanced.

Figure 9A:
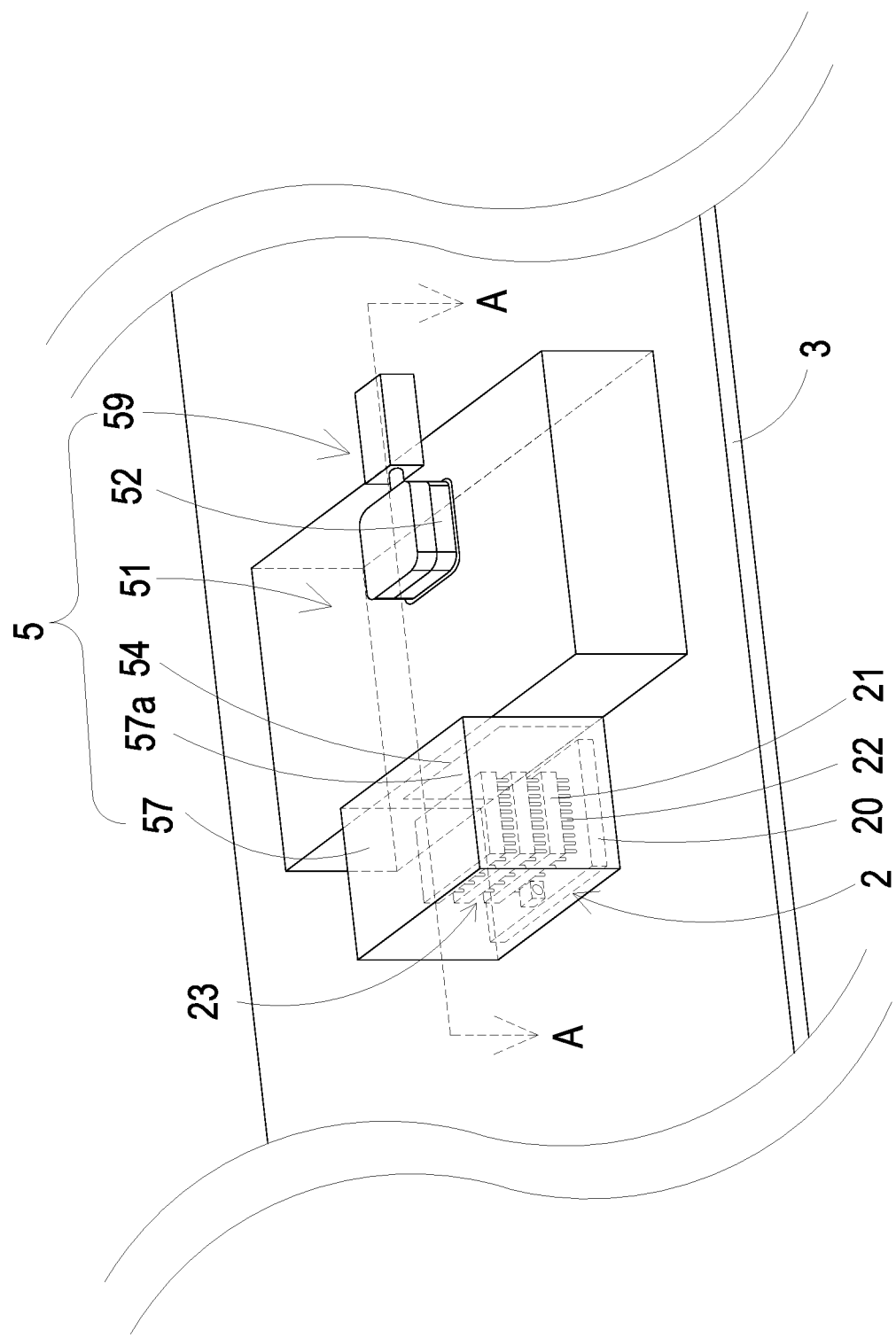
FIG. 9A is a schematic perspective view illustrating the structure of a three-dimensional integrated circuit cooling system according to a third embodiment of the present invention.
Figure 9B:
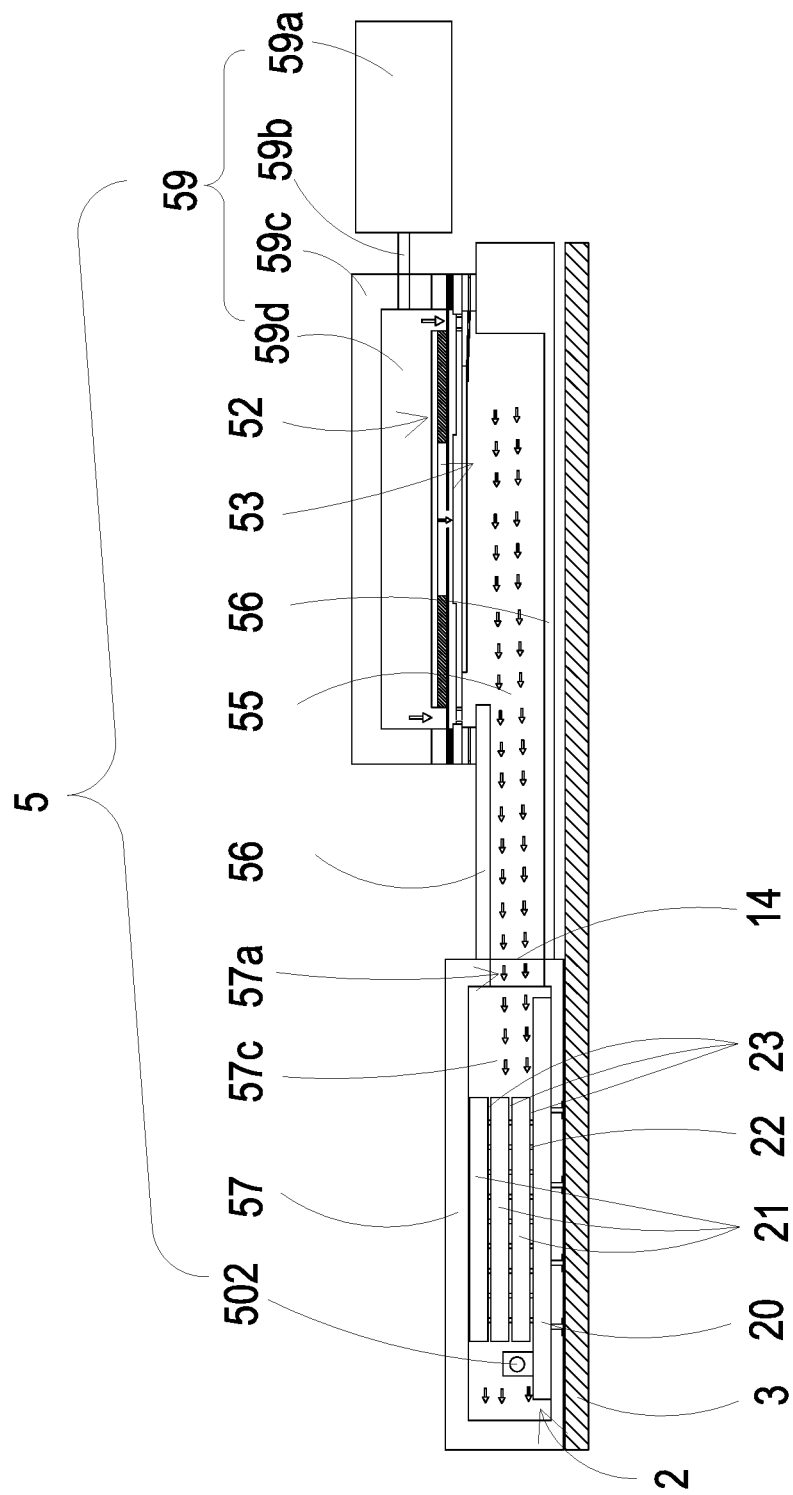
FIG. 9B is a schematic cross-sectional view illustrating the three-dimensional integrated circuit cooling system of FIG. 9A.

FIG. 9A is a schematic perspective view illustrating the structure of a three-dimensional integrated circuit cooling system according to a third embodiment of the present invention, and FIG. 9B is a schematic cross-sectional view illustrating the three-dimensional integrated circuit cooling system of FIG. 9A taken along the section AA. As shown in FIGS. 9A and 9B, the three-dimensional integrated circuit cooling system 5 according to the third embodiment of the present invention is applied to remove heat generated by the three-dimensional integrated circuit 2. The three-dimensional integrated circuit cooling system 5 includes a base 51, a fluid pump 52, a casing 57 and a fluid storage 59. The base 51 is located beside the three-dimensional integrated circuit 2 and has an introduction opening 53, a discharge opening 54 and a fluid passage 55. The base 51 includes plural partitions 56 assembled with each other. The assembly of the partitions 56 defines the introduction opening 53, the discharge opening 54 and the fluid passage 55. The fluid pump 52 is fixed on the introduction opening 53 of the base 51 as sealing the edge of the introduction opening 53. The fluid pump 52 is a piezoelectric fluid pump for guiding the fluid to the introduction opening 53. In this embodiment, the component parts, element and function of the base 51 and the fluid pump 52 are similar to those of the first embodiment of the present invention, and are not redundantly described herein. In comparison with those of the first embodiment of the present invention, the three-dimensional integrated circuit cooling system 5 further includes a casing 57 and a fluid storage 59. The casing 57 may be made by plastic and has an inlet 57a and an accommodation space 57c. The casing 57 encapsulates the three-dimensional integrated circuit 2, and the three-dimensional integrated circuit 2 is disposed within the accommodation space 57c. The inlet 47a is disposed corresponding to and in communication with the discharge opening 54. The fluid storage 59 includes a storage tank 59a, a pipe 59b and a housing 59c. The housing 59c is mounted on the fluid pump 52 to enclose and seal the fluid pump 52, while an inner space 59d of the housing 59c is in communication with the input apertures of the fluid pump 52. The pipe 59b is for example but not limited to a hollow pipe, and is in communication between the storage tank 59a and the inner space 59d of the housing 59c. The storage tank 59a is for example but not limited to a hollow tank for storing the fluid. By driving the fluid pump 52, the fluid stored in the storage tank 59a is guided into the fluid passage 55 through the pipe 59b, the inner space 59d and the introduction opening 53. Then, the fluid flows into the accommodation space 57c through the discharge opening 54 and the inlet 57a. Afterwards, the fluid passes along every fluid microchannel 23 of the three-dimensional integrated circuit 2 so as to perform heat exchange with the plural middle chip layers 21 and the main chip layer 20. When the fluid pump 52 stops operating, the heated fluid flows back into the fluid storage 59. Consequently, the heat dissipation of the three-dimensional integrated circuit 2 is realized. In an embodiment, the fluid for cooling is for example but not limited to a gaseous coolant such as gaseous refrigerant, air, hydrogen, carbon dioxide, inert gas, and so on. Alternatively, the fluid for cooling is for example but not limited to a liquid coolant such as liquid chlorofluorocarbons (CFCs) or other liquid refrigerant. The actual fluid can be adjusted in accordance with the practical requirements of the heat-dissipating effect.

Figure 9C:
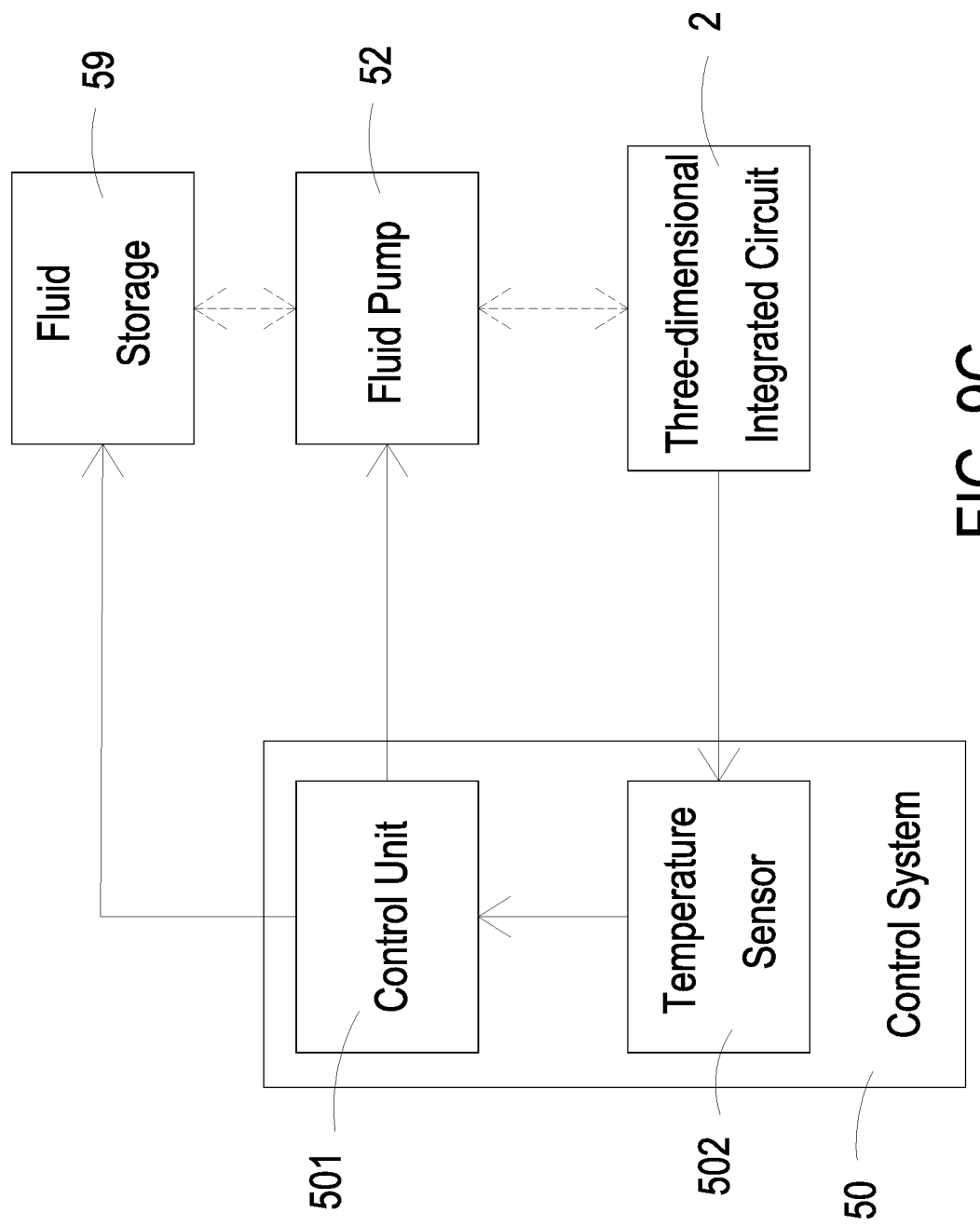
FIG. 9C is a schematic block diagram illustrating a control system for the three-dimensional integrated circuit cooling system according to the third embodiment of the present invention.

Please refer to FIGS. 9A, 9B and 9C. FIG. 9C is a schematic block diagram illustrating a control system for the three-dimensional integrated circuit cooling system according to the third embodiment of the present invention. In an embodiment, the three-dimensional integrated circuit cooling system 5 has the function of temperature control and includes a control system 50. The control system 50 includes a control unit 501 and a temperature sensor 502. The control unit 501 is electrically connected with the fluid pump 52 so as to control the operation of the fluid pump 52. The temperature sensor 502 may be located in the accommodation space 57c of the casing 57 and near the surrounding of the three-dimensional integrated circuit 2, so as to detect the temperature of the three-dimensional integrated circuit 2. Alternatively, the temperature sensor 502 may be directly attached on the main chip layer 20 or the middle chip layer 21 of the three-dimensional integrated circuit 2, so as to detect the temperature of the three-dimensional integrated circuit 2. The temperature sensor 502 is electrically connected with the control unit 501 to which the detected temperature as a detecting signal is transmitted. According to the detecting signal from the temperature sensor 502, the control unit 501 judges whether the temperature of the three-dimensional integrated circuit 2 is higher than a temperature threshold value. If the temperature of the three-dimensional integrated circuit 2 is higher than the temperature threshold value, the control unit 501 sends a control signal to the fluid pump 52 for enabling the fluid pump 52. Therefore, the fluid pump 52 drives the fluid to remove the heat generated by the three-dimensional integrated circuit 2, and the temperature of the three-dimensional integrated circuit 2 is reduced. On the contrary, if the temperature of the three-dimensional integrated circuit 2 is lower than the temperature threshold value, the control unit 501 sends a control signal to the fluid pump 52 for disabling the fluid pump 52. As so, the fluid pump 52 operates only when high temperature is detected, thus the life span of the fluid pump 52 can be prolonged. Namely, by disposing the control system 50, the three-dimensional integrated circuit 2 dissipates heat via the fluid pump 52 of the three-dimensional integrated circuit cooling system 1 when the temperature thereof is too high, and the three-dimensional integrated circuit 2 is stopped operating when the temperature thereof is low enough. Consequently, the life span of the fluid pump 52 is prolonged, and the unneeded wastage of energy is reduced. Moreover, the three-dimensional integrated circuit 2 can operate under a suitable temperature environment, and the stability of the three-dimensional integrated circuit 2 is enhanced.

In an embodiment, the control unit 501 of the control system 50 controls the input voltage of the fluid pump 52 to maintain at a specific voltage. Therefore, the fluid pump 52 outputs the maximum pressure, and the best heat-dissipating efficiency is achieved. Alternatively, the control unit 501 of the control system 50 controls the operation of fluid pump 52 to speed up or slow down. Therefore, the fluid pump 52 operates in accordance with the practical requirements of heat-dissipating. Consequently, by the temperature detection and control of the control system 50, the life span of the fluid pump 52 is prolonged, and the unneeded wastage of energy is reduced. Moreover, the three-dimensional integrated circuit 2 can operate under a suitable temperature environment, and the stability of the three-dimensional integrated circuit 2 is enhanced.

From the above descriptions, the present invention provide a three-dimensional integrated circuit cooling system, which is applied to various three-dimensional integrated circuits to remove heat generated by the middle chip layer or the main chip layer inside the three-dimensional integrated circuit. The use of the three-dimensional integrated circuit cooling system can increase the heat-dissipating efficiency and prevent generating unacceptable noise. Consequently, the performance of the three-dimensional integrated circuit of the electronic device is stabilized, and the life spans of the three-dimensional integrated circuit are extended. In addition, the three-dimensional integrated circuit cooling system has the function of temperature control, which can control the operation of the fluid pump according to the variation of temperature inside the three-dimensional integrated circuit. Consequently, the heat-dissipating efficiency is enhanced, and the life span of the heat-dissipating device is prolonged.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A three-dimensional integrated circuit cooling system for removing heat from a three-dimensional integrated circuit, wherein the three-dimensional integrated circuit comprises a main chip layer, plural middle chip layers and plural fluid microchannels, wherein the main chip layer and the plural middle chip layers are stacked on each other while every two neighboring middle chip layers are in electrical communication through plural leads, and the main chip layer and the neighboring middle chip layer are in electrical communication through plural leads, wherein the plural fluid microchannels are formed between every two neighboring middle chip layers, and formed between the main chip layer and the neighboring middle chip layer, the three-dimensional integrated circuit cooling system comprising:
    a base located beside the three-dimensional integrated circuit and having an introduction opening, a discharge opening and a fluid passage;
    a casing having an inlet and an accommodation space, wherein the casing encapsulates the three-dimensional integrated circuit, the three-dimensional integrated circuit is disposed within the accommodation space, the inlet is disposed corresponding to the discharge opening, and the inlet is in communication with the discharge opening;
    a fluid pump fixed on the base and sealing the edge of the introduction opening; and
    a fluid storage configured to store a fluid, enclosing the fluid pump and in communication with the fluid pump;
    wherein when the fluid pump is enabled, the fluid stored in the fluid storage is introduced into the fluid passage through the introduction opening, and guided into the accommodation space of the casing through the discharge opening and the inlet of the casing, then the fluid passes along each of the fluid microchannels of the three-dimensional integrated circuit as flowing through the plural middle chip layers and the main chip layer, so as to perform heat exchange between the fluid and any of the plural middle chip layers and heat exchange between the fluid and the main chip layer, wherein when the fluid pump stops operating, the heated fluid flows back into the fluid storage.

2. The three-dimensional integrated circuit cooling system according to claim 1, wherein the base comprises plural partitions assembled with each other, the plural partitions define the introduction opening, the discharge opening and the fluid passage.

3. The three-dimensional integrated circuit cooling system according to claim 1, wherein the fluid pump is a piezoelectric fluid pump.

4. The three-dimensional integrated circuit cooling system according to claim 3, wherein the piezoelectric fluid pump comprises:
    a fluid inlet plate comprising at least one fluid inlet, at least one convergence channel and a central cavity, wherein a convergence chamber is defined by the central cavity, the at least one convergence channel corresponds to the at least one fluid inlet, and wherein after the fluid is introduced into the at least one convergence channel through the at least one fluid inlet, the fluid is guided by the at least one convergence channel and converged to the convergence chamber;
    a resonance plate having a central aperture, wherein the central aperture is aligned with the convergence chamber, and the resonance plate has a movable part near the central aperture; and
    a piezoelectric actuator aligned with the resonance plate;
    wherein a gap is formed between the resonance plate and the piezoelectric actuator to define a chamber, wherein when the piezoelectric actuator is enabled, the fluid is fed into the fluid pump through the at least one fluid inlet of the fluid inlet plate, converged to the central cavity through the at least one convergence channel, transferred through the central aperture of the resonance plate, and introduced into the chamber, and the fluid is further transferred through a resonance between the piezoelectric actuator and the movable part of the resonance plate.

5. The three-dimensional integrated circuit cooling system according to claim 4, wherein the piezoelectric actuator comprises:
    a suspension plate having a first surface and an opposing second surface, wherein the suspension plate is permitted to undergo a curvy vibration;
    an outer frame arranged around the suspension plate;
    at least one bracket connected between the suspension plate and the outer frame for elastically supporting the suspension plate; and
    a piezoelectric plate, wherein a length of the piezoelectric plate is smaller than or equal to a length of the suspension plate, the piezoelectric plate is attached on the first surface of the suspension plate, and wherein when a voltage is applied to the piezoelectric plate, the suspension plate is driven to undergo the curvy vibration.

6. The three-dimensional integrated circuit cooling system according to claim 5, wherein the suspension plate is a square suspension plate having a bulge formed on the second surface thereof.

7. The three-dimensional integrated circuit cooling system according to claim 4, wherein the piezoelectric fluid pump comprises a conducting plate and two insulation plates, and the fluid inlet plate, the resonance plate, the piezoelectric actuator, one of the two insulation plates, the conducting plate and the other insulation plate are stacked on each other sequentially.

8. The three-dimensional integrated circuit cooling system according to claim 1, further comprising a control system, wherein the control system comprises:
    a control unit electrically connected with the fluid pump for controlling operations of the fluid pump; and
    a temperature sensor electrically connected with the control unit and located near the three-dimensional integrated circuit, wherein the temperature sensor detects a temperature of the three-dimensional integrated circuit and generates a corresponding detecting signal to the control unit;
    wherein the control unit obtains the temperature of the three-dimensional integrated circuit according to the detecting signal, wherein if the control unit determines that the temperature of the three-dimensional integrated circuit is higher than or equal to a temperature threshold value, the control unit enables the fluid pump to drive the fluid, and wherein if the control unit determines that the temperature of the three-dimensional integrated circuit is lower than the temperature threshold value, the control unit disables the fluid pump.

9. The three-dimensional integrated circuit cooling system according to claim 8, wherein the control unit controls an input voltage of the fluid pump to maintain at a specific voltage so that the fluid pump outputs a maximum pressure.

10. The three-dimensional integrated circuit cooling system according to claim 8, wherein the control unit controls the operations of the fluid pump to speed up or slow down.

11. A three-dimensional integrated circuit cooling system for removing heat from a three-dimensional integrated circuit, wherein the three-dimensional integrated circuit comprises a main chip layer, plural middle chip layers and plural fluid microchannels, wherein the main chip layer and the plural middle chip layers are stacked on each other while every two neighboring middle chip layers are in electrical communication through plural leads, and the main chip layer and the neighboring middle chip layer are in electrical communication through plural leads, wherein the plural fluid microchannels are formed between every two neighboring middle chip layers, and formed between the main chip layer and the neighboring middle chip layer, the three-dimensional integrated circuit cooling system comprising:
- a base located beside the three-dimensional integrated circuit and having an introduction opening, a discharge opening and a fluid passage;
- a casing having an inlet, an outlet and an accommodation space, wherein the casing encapsulates the three-dimensional integrated circuit, the three-dimensional integrated circuit is disposed within the accommodation space, the inlet is disposed corresponding to the discharge opening, and the inlet is in communication with the discharge opening;
- a fluid pump fixed on the base and sealing the edge of the introduction opening; and
- a filtering system comprising a housing, a pipe and a filter, wherein the housing is disposed on the fluid pump to enclose the fluid pump, and the housing defines an inner space in communication with the fluid pump, the pipe is in communication between the filter and the housing;

wherein when the fluid pump is enabled, a fluid is driven by the fluid pump and filtered by the filter, then the fluid flows into the inner space of the housing through the pipe, introduced into the fluid passage from the inner space through the introduction opening, discharged from the discharge opening and guided into the accommodation space of the casing through the inlet, then the fluid passes along each of the fluid microchannels of the three-dimensional integrated circuit as flowing through the plural middle chip layers and the main chip layer, so as to perform heat exchange between the fluid and any of the plural middle chip layers and heat exchange between the fluid and the main chip layer, and the heated fluid is discharged to the exterior surroundings of the three-dimensional integrated circuit through the plural fluid microchannels and the outlet of the casing.

12. The three-dimensional integrated circuit cooling system according to claim 11, wherein the filtering system comprises a filtering screen, and the filtering screen is mounted on the outlet of the casing as sealing the edge of the outlet.

* * * * *